(12) United States Patent
Fujieda

(10) Patent No.: US 7,490,301 B2
(45) Date of Patent: Feb. 10, 2009

(54) COMPUTER READABLE RECORDING MEDIUM STORING PROGRAM FOR MANAGING CAD DATA

(75) Inventor: Makoto Fujieda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 174 days.

(21) Appl. No.: 09/854,622

(22) Filed: May 15, 2001

(65) Prior Publication Data

US 2002/0080194 A1    Jun. 27, 2002

(30) Foreign Application Priority Data

Dec. 25, 2000    (JP)    ............... 2000-392624

(51) Int. Cl.
    *G06F 3/00*    (2006.01)
(52) U.S. Cl. ........................ 715/853; 700/97
(58) Field of Classification Search .............. 700/97; 345/700
    See application file for complete search history.

(56) References Cited

U.S. PATENT DOCUMENTS

| | | | | |
|---|---|---|---|---|
| 5,089,970 A * | 2/1992 | Lee et al. ....................... 700/96 |
| 5,278,979 A * | 1/1994 | Foster et al. ................. 707/203 |
| 5,418,728 A * | 5/1995 | Yada ............................ 700/97 |
| 5,777,877 A * | 7/1998 | Beppu et al. .................. 700/97 |
| 5,856,925 A * | 1/1999 | Maeda et al. .................. 716/5 |
| 6,088,625 A * | 7/2000 | Kellstrom, Jr. ............... 700/97 |
| 6,324,587 B1 * | 11/2001 | Trenbeath et al. ........... 719/310 |
| 6,611,725 B1 * | 8/2003 | Harrison et al. ............... 700/98 |
| 6,647,380 B1 * | 11/2003 | Yotsukura ...................... 707/2 |
| 6,944,516 B1 * | 9/2005 | Collins et al. ............... 700/109 |
| 2001/0016803 A1 * | 8/2001 | Sartiono et al. ................ 703/1 |
| 2002/0026385 A1 * | 2/2002 | McCloskey et al. ........... 705/27 |

OTHER PUBLICATIONS

MS Windows NT Explorer. 1998. Screen shots of copying a file. pp. 1-4.*

* cited by examiner

*Primary Examiner*—Stephen S Hong
*Assistant Examiner*—Ryan F Pitaro
(74) *Attorney, Agent, or Firm*—Staas & Halsey LLP

(57) ABSTRACT

There is provided a computer readable recording medium that stores a program for managing CAD data so as to easily reproduce an assembly structure previously confirmed by an operator. The program causes a computer to perform first and second steps. The first step causes a unit to be displayed on the basis of assembly data and parts data in response to a display request. The parts data includes data about shapes of parts and version information about versions of the parts. The assembly data defines a structure of the unit formed by one or more parts. The second step assigns the version information about parts that form the unit displayed to the assembly data.

10 Claims, 24 Drawing Sheets

EXAMPLE OF DATA STRUCTURE IN DB

EXAMPLE OF LOADING LATEST STATE

EXAMPLE OF LOADING AT-REGISTRATION STATE

EXAMPLE OF DATA STRUCTURE IN DB

COMPUTER READABLE RECORDING MEDIUM STORING PROGRAM FOR MANAGING CAD DATA

BACKGROUND OF THE INVENTION

1. Field of the Invention

The present invention relates to a computer readable recording medium that stores a program for managing CAD (Computer-Aided Design) data, and more particularly to a computer readable recording medium that stores a program for managing CAD data including parts data and assembly data.

2. Description of the Related Art

Recently, parts of a product such as automobile parts are designed using a three-dimensional CAD system. In the three-dimensional CAD, parts are designed and are then combined into an assembly. Generally, parts of a product having a complex structure are designed by a plurality of operators who forms a group and cooperate with each other.

Generally, CAD data that is used in the group-based design work is managed by a management system, which enables a plurality of operators engaged in design to share three-dimensional CAD data. More particularly, the general management system enables the operators to share an object in an assembly and mutually refer to it. This makes it possible for each operator to get along with his/her design work of associated parts.

It is required that the three-dimensional CAD maintains a data structure called assembly formed by a plurality of files, while managing the locations of the files. In many cases, the assembly that forms a product has a multistage hierarchical structure. For example, when a final product consists of a plurality of sub-units and each of the sub-units consists of a plurality of specific parts, the assembly of the final product has a multistage hierarchical structure.

In the group-based design work, each designer or operator may individually design parts having a lower structure in the multistage arrangement. In this case, the operators sequentially update the files of parts located at a lower level of the assembly. Therefore, each operator is needed to carry on his/her design work while checking the progress of others' design works.

However, a problem may occur if an operator gets along with his/her design work while referring to data handled by another operator. If the contents of data that has been referred to are changed, the operator will be needed to retrace his/her design work. With the above in mind, it is thought that the management system for three-dimensional CAD data is modified so that an indication of approval/disapproval can be given to each file by a person who is responsible for the design work. Each operator gets along with his/her design work while referring to only files that have been approved by the responsible person. Each operator is no longer needed to retrace his/her design work.

However, if the operator waits for approval of all files related to his/her work, he or she may not get along with his/her work efficiently. For example, the operator will not be able to promote his/her works simultaneously. This may result in a delay of development. Consequently, it is desired to provide a file management system capable of reproducing the assembly structure that was valid at the time of checking whether there is a problem at the operator level. If each operator is given means for getting information about the assembly structure that was valid at the time of the operator-level check, each operator will be able to get along with his/her work while keeping conformation of parts of the reproduced assembly structure.

SUMMARY OF THE INVENTION

Taking the above into consideration, an object of the present invention is to provide a computer readable recording medium that stores a program for managing CAD data so as to easily reproduce an assembly structure previously confirmed by an operator.

To accomplish the object, according to the present invention, there is provided a computer readable recording medium storing a program for causing a computer to perform the steps of: (a) causing a unit to be displayed on the basis of assembly data and parts data in response to a display request, the parts data including data about shapes of parts and version information about versions of the parts, the assembly data defining a structure of the unit formed by one or more parts; and (b) assigning the version information about parts that form the unit displayed to the assembly data.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 5(A), 5(B) and 5(C) schematically illustrate shapes of a first part, wherein FIG. 5(A) illustrates a shape of the first part defined by parts data of the fifth version, FIG. 5(B) illustrates a shape of the first part defined by parts data of the fourth version, and FIG. 5(C) illustrates a shape of the first part defined by parts data of the third version;

FIGS. 6(A) and 6(B) schematically illustrate shapes of a second part, wherein FIG. 6(A) illustrates a shape of the second part defined by parts data of the third version, and FIG. 6(B) illustrates a shape of the second part defined by parts data of the second version;

DESCRIPTION OF THE PREFERRED EMBODIMENTS

A description will now be given of an embodiment of the present invention with reference to the accompanying drawings.

Figure 1:
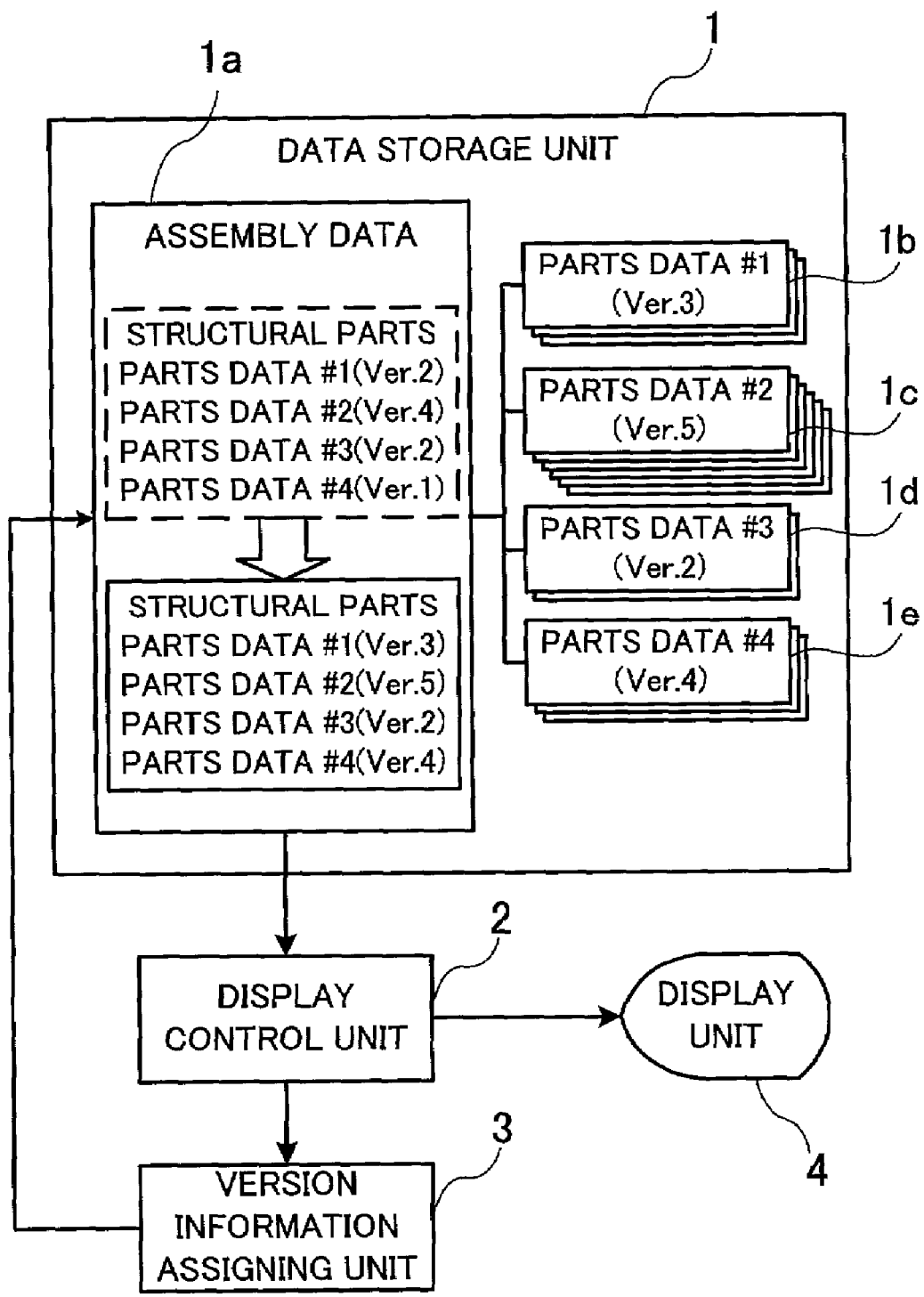
FIG. 1 is a diagram illustrating the principles of the present invention.

FIG. 1 illustrates the principles of the present invention. A system shown in FIG. 1 includes a data storage unit 1, a display control unit 2, and a version information assigning unit 3.

The data storage unit 1 stores three-dimensional data. The three-dimensional data is composed of assembly data 1a and items 1b, 1c, 1d and 1e of parts data. The assembly data 1a includes data that defines the way of combining parts used to form a product (unit). More particularly, the assembly data 1a includes an identifier of parts data, and information indicating the version of parts data that was used when a confirmation work was performed.

The items 1b, 1c, 1d and 1e of parts data include the definitions of shapes of parts that form a product. The versions of the items 1b, 1c, 1d and 1e of parts data are managed so as to hold parts data of the latest version as well as parts data of old versions.

A display unit 4 is connected to the display control unit 2. The display control unit 2 acquires, from the data storage unit 1, data necessary to display a product defined by the assembly data 1a in response to a display request, which specifies the assembly data 1a therein. The present embodiment of the invention employs two types of display request. The first type makes a request for displaying the latest state of data. The second type makes a request for displaying a state that was at registration of data.

For the request for displaying the latest state, the display control unit 2 acquires, from the data storage unit 1, the assembly data 1a and the parts data of the latest version about each parts item included in the assembly data 1a. For the request for displaying the state at registration, the display control unit 2 acquires the assembly data 1a from the data storage unit 1, and refers to version information about each parts item included in the assembly data 1a. Then, the display control unit 2 acquires parts data of the versions indicated by the version information from the data storage unit 1.

The display control unit 2 causes an image of the unit (product) formed by the data acquired from the data storage unit 1 to be displayed on the display unit 4.

The version information assigning unit 3 assigns, to the assembly data 1a stored in the data storage unit 1, version information indicating the versions of parts used to form the unit and displayed under the control of the display control unit 2.

Thus, the version information is updated each time the structure of the unit is displayed. When the display control unit 2 controls the display unit 4 to display a unit in response to the display request for the at-registration state, the version information specified in the assembly data 1a coincides with the versions of the parts that form the unit displayed. In this case, the version information is not updated.

When the structure of the unit is displayed in the above-mentioned manner, the version information about the parts that form the structure of the unit (product) is assigned to the assembly data 1a. It is now assumed that the latest versions of the items 1b, 1c, 1d and 1e of parts data are the third, fifth, second and fourth versions, respectively. It is further assumed that the assembly data 1a is assigned the version information indicating the second, fourth, second and first versions in association with the items 1b, 1c, 1d and 1e of parts data, respectively. If the request for displaying the latest state, the structure of the unit is displayed using the latest versions of the items 1b, 1c, 1d and 1e of parts data. Then, the version information assigning unit 3 assigns the assembly data 1a the latest versions (the third, fifth, second and fourth versions) of the items 1b, 1c, 1d and 1e of parts data, respectively.

This makes it possible, in future, to reproduce the structure of the unit confirmed on the display by the operator. Thus the unit structure formed by the latest parts data can easily be compared with that which was confirmed previously.

The embodiment of the present invention is described below in detail.

Figure 2:
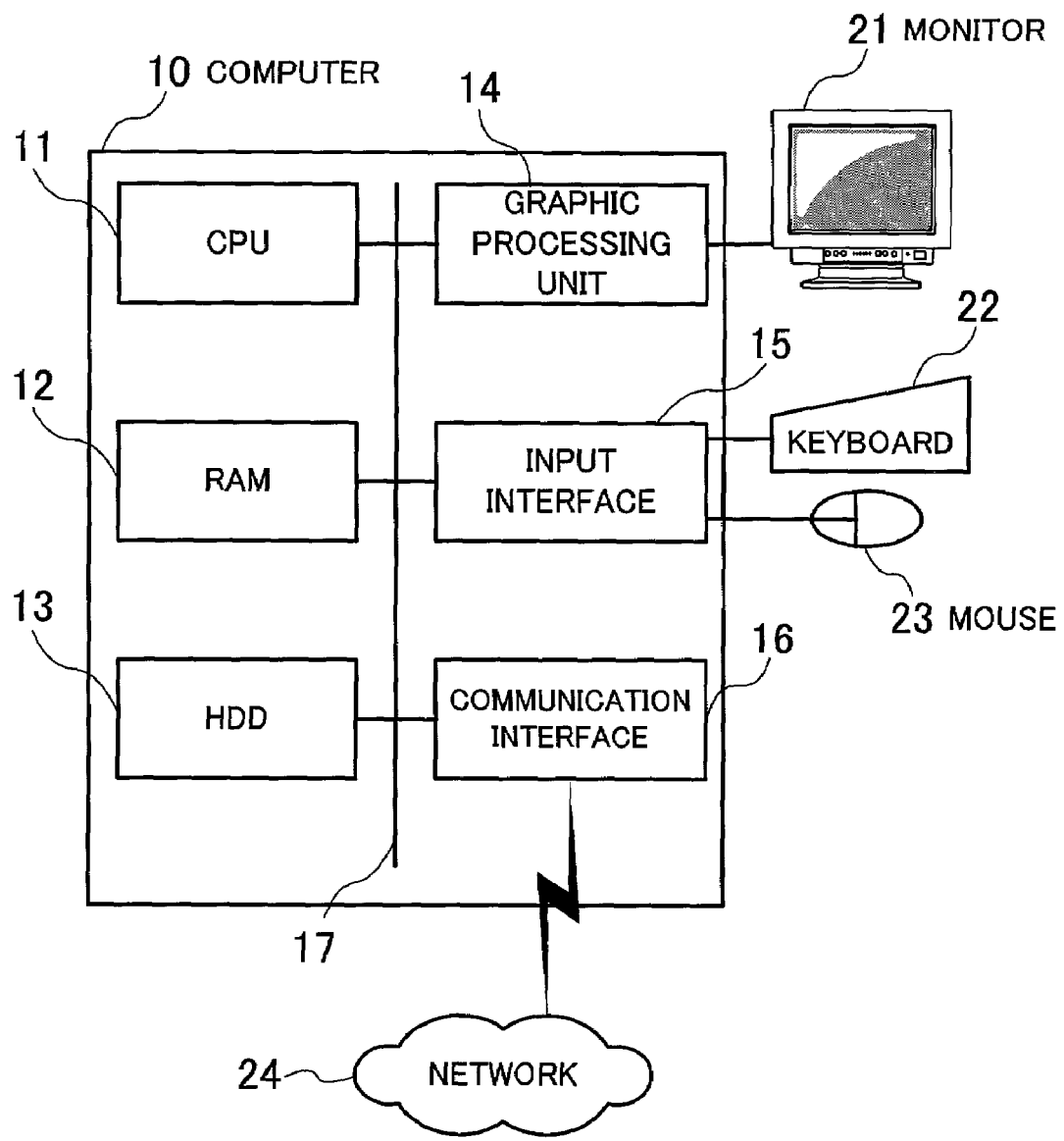
FIG. 2 is a diagram of a configuration of a computer used for management of CAD data.

FIG. 2 is a diagram of a configuration of a computer 10 used to manage CAD data. The entire computer 10 is controlled by a CPU 11, to which a RAM 12, a hard disk drive (HDD) 13, a graphic processing unit 14, an input interface 15, and a communication interface 16 are connected via a bus 17.

The RAM 12 stores an operating system (OS) and temporarily stores at least a part of a CAD program executed by the CPU 11. The RAM 12 stores various data necessary for processing by the CPU 11. The HDD 13 stores the operating system, CAD program, and CAD data.

A monitor 21 is connected to the graphic processing unit 14, which causes images such as CAD drawings to be displayed on the monitor 21 in accordance with a command issued by the CPU 11. A keyboard 22 and a mouse 23 are connected to the input interface 15, which transmits signals from the keyboard 22 and the mouse 23 to the CPU 11 via the bus 17.

The communication interface 16 is connected to a network 24, which may, for example, be a broadband network such as an Internet. The communication interface 16 sends and receive data to and from another computer via the network 24.

The above-mentioned hardware structure is used to realize the processes and functions of the embodiment of the present invention.

Figure 3:
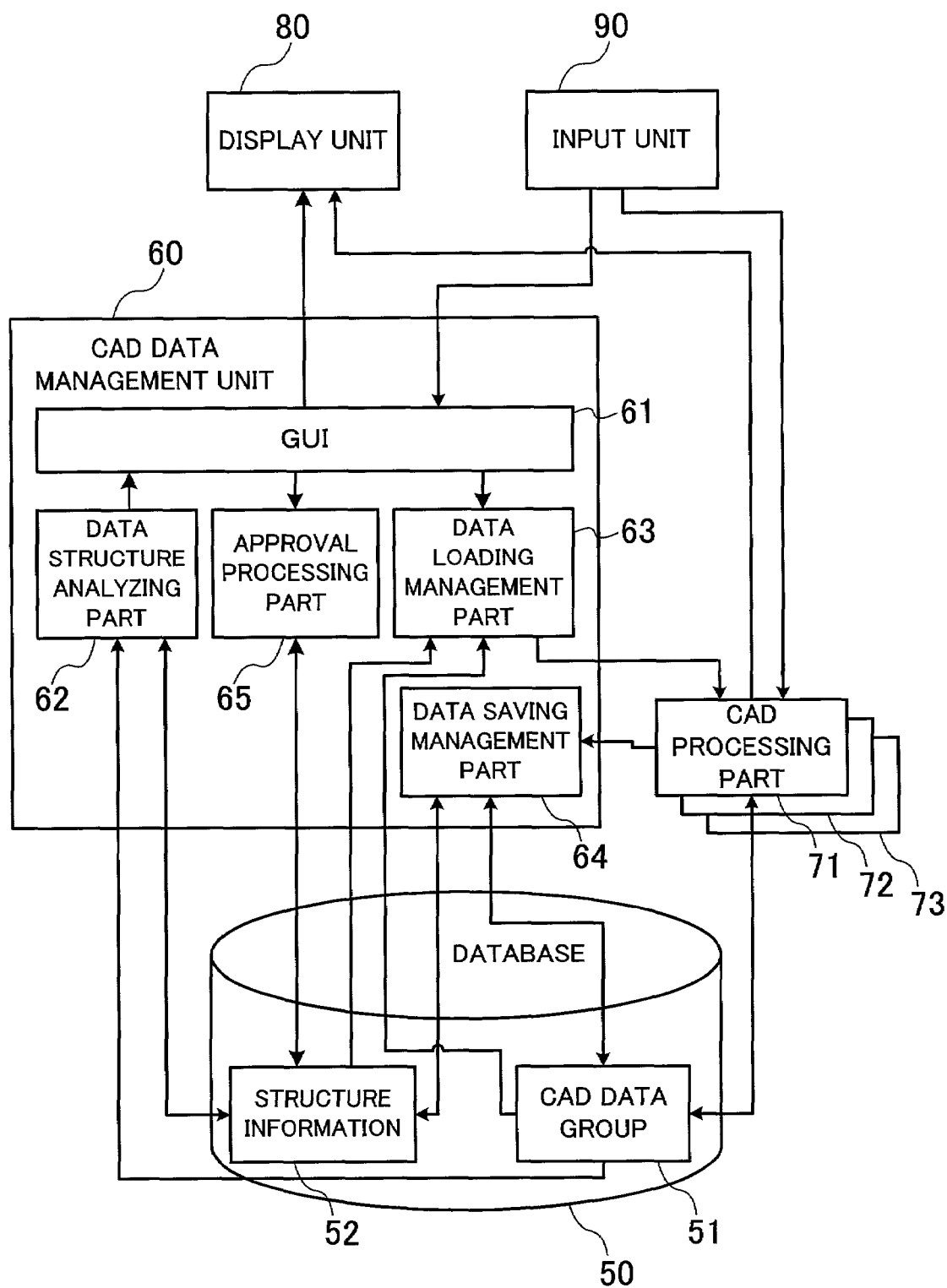
FIG. 3 is a block diagram of processes and functions according to an embodiment of the present invention.

FIG. 3 is a block diagram of processes and functions of the embodiment of the present invention. As shown in FIG. 3, a database (DB) 50 stores a group 51 of CAD data and structure information 52. The group 51 of CAD data includes a plurality of items of CAD data created by various types of CAD processing parts 71 through 73. The structure information 52 indicates a structure of each item of CAD data. The structure information 52 includes at-registeration information that specifies an assembly structure previously confirmed by the operator.

A CAD data management unit 60 is equipped with the function of managing CAD data used when a product is designed by group work. The CAD data management unit 60 includes a GUI (Graphical User Interface) 61, a data structure analyzing part 62, a data loading management part 63, a data saving management part 64, and an approval processing part 65.

The GUI 61 causes a display unit 80 to display the structure of the group 51 of CAD data stored in the database 50. The GUI 61 outputs various control commands to the data loading management part 63 and the approval processing part 65 on the basis of a signal supplied from an input unit 90. An example of the control commands is a load command supplied to the data loading management part 63.

The data loading management part 63 determines CAD data to be loaded by referring to the structure information 52 in accordance with the load command supplied from the GUI 61. The data loading management part 63 outputs a load request for the CAD data thus determined to the CAD processing parts 71 through 73, which can edit CAD data.

The data saving management part 64 updates the at-registration information specified in the structure information 52 in response to requests for saving CAD data from the CAD processing parts 71 through 73.

The approval processing part 65 sets a flag indicative of approval/disapproval to parts data and assembly data that form CAD data in response to an approval request command supplied from the GUI 61. Here, an approval means that a person responsible for design of parts acknowledges parts defined in the CAD data to be formal.

The CAD processing parts 71 through 73 are capable of performing respective three-dimensional CAD by individual application software (CAD software). The CAD processing parts 71 through 73 is capable of creating items of CAD data having mutually different data structures. The CAD data created is stored in the database 50.

The CAD processing parts 71 through 73 load CAD data from the database 50 in response to a load command from the data loading management part 63. The CAD processing parts 71 through 73 cause the loaded data to be displayed on the display unit 80. The CAD processing parts 71 through 73 can save the loaded CAD data to the database 50. The CAD processing parts 71 through 73 output a save request to the data saving management part 64 when saving CAD data.

The display unit 80 can display information on its screen on the basis of image information supplied from the CAD data management unit 60 and the CAD processing parts 71 through 73. The display unit 80 may, for example, be the monitor 21 shown in FIG. 2. The input unit 90 is equipped with keys operated by the operator, and outputs a signal based on a key operation to the CAD data management unit 60 and the CAD processing parts 71 through 73. The input unit 90 may, for example, be the keyboard 22 and the mouse 23 shown in FIG. 2.

Figure 4:
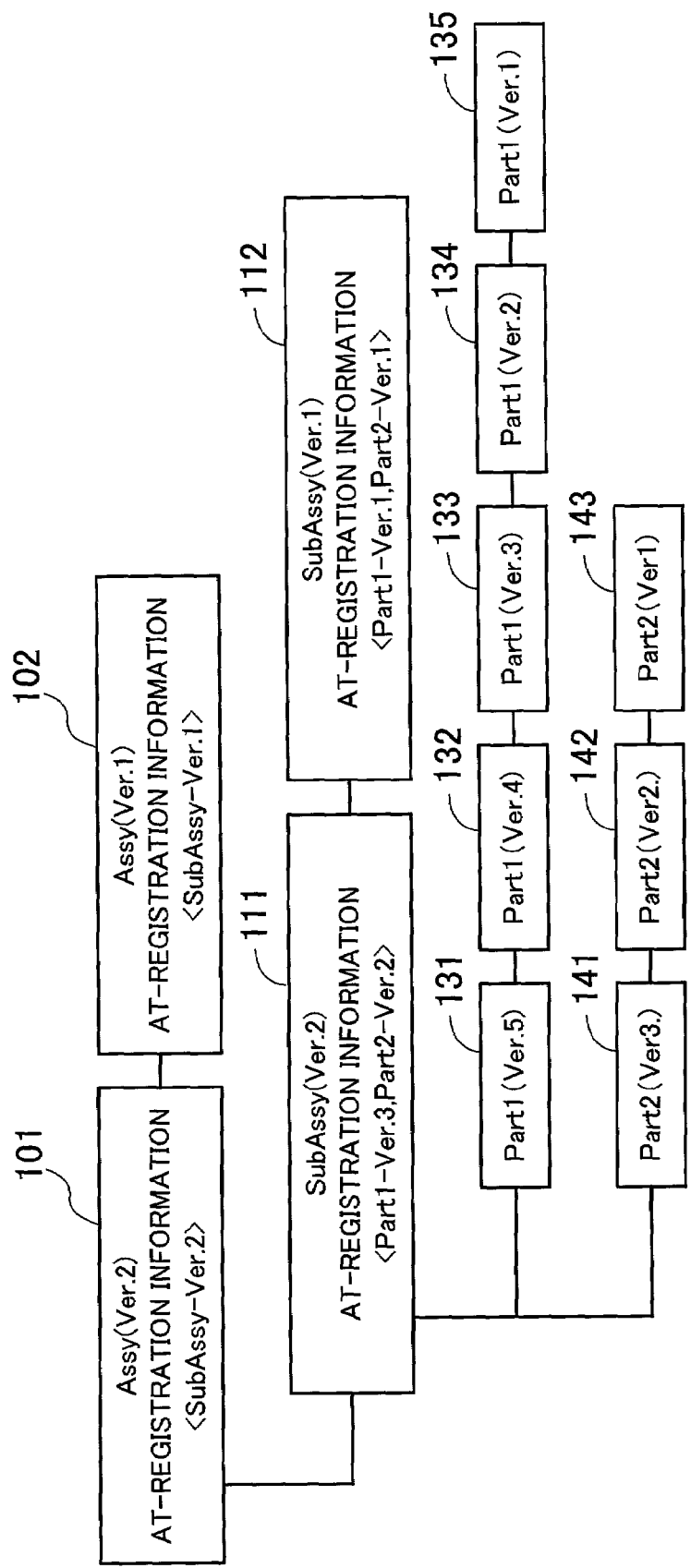
FIG. 4 illustrates an example of three-dimensional CAD data stored in a database.

FIG. 4 shows an example of three-dimensional CAD data stored in the database 50. The three-dimensional CAD data has a hierarchical structure. The final structure of a product (unit) is prescribed by assembly data 101 located at the top of the hierarchical structure. Sub-assembly data 111 is provided as a lower structure located under the assembly data 101. That is, the product defined by the assembly data 101 is made up of sub-units defined by the sub-assembly data 111.

Items 131 and 141 of parts data are provided as lower structures located under the sub-assembly data 111. That is, the sub-units defined by the sub-assembly data 111 are formed by parts defined by the items 131 and 141 of parts data. The sub-assembly data 111 defines the structures of sub-units included in the product.

The versions of three-dimensional CAD data are managed. In the version management, items of data of old versions included in the three-dimensional CAD data are saved. The latest version of the assembly data 101 is the second version (Ver. 2), and assembly data 102 of the first version (Ver. 1) is also saved.

The latest version of the sub-assembly data 111 is the second version (Ver. 2), and assembly data 112 of the first version (Ver. 1) is also saved in the database 50. The latest version of parts data 131 is the fifth version (Ver. 5), and items 132, 133, 134 and 135 of parts data of the fourth (Ver. 4), third (Ver. 3), second (Ver. 2) and first (Ver. 1) versions are also saved in the database 50. The latest version of parts data 141 is the third version (Ver. 3), and items 142 and 143 of parts data of the second (Ver. 2) and first (Ver. 1) versions are also saved in the database 50.

The items 101 and 102 of assembly data and items 111 and 112 thereof are respectively assigned items of at-registration information. The at-registration information indicates the versions of parts based on the assembly data that were used when the structure formed by these parts was confirmed by the operator.

In the example shown in FIG. 4, an item of information <SubAssy-Ver.2.> that indicates the sub-assembly data 111 of the second version is set in the at-registration information of the assembly data 101 of the latest (second) version. An item of information <SubAssy-Ver.1> that indicates the sub-assembly data 112 of the first version is set in the at-registration information of the assembly data 102 of the first version. An item of information <Part1-Ver.3> and an item of information <Part2-Ver.2> are set in the at-registration information of the sub-assembly data 111 of the latest (second) version. The item of information <Part1-Ver.3> indicates parts data 133 of the third version about the first part. The item of information <Part2-Ver.2> indicates parts data 142 of the second version about the second part. An item of information <Part1-Ver.1> and an item of information <Part2-Ver.1> are set in the at-registration information of the sub-assembly data 112 of the first version. The item of information <Part1-Ver.1> indicates parts data 135 of the third version about the first part. The item of information <Part2-Ver.1> indicates parts data 143 of the first version about the second part.

According to the present embodiment of the invention, the at-registration information is included in the assembly data in the above-mentioned manner. Therefore, it is possible to easily recognize which version was referred to in the past.

Figures 5A, 5B, 5C:
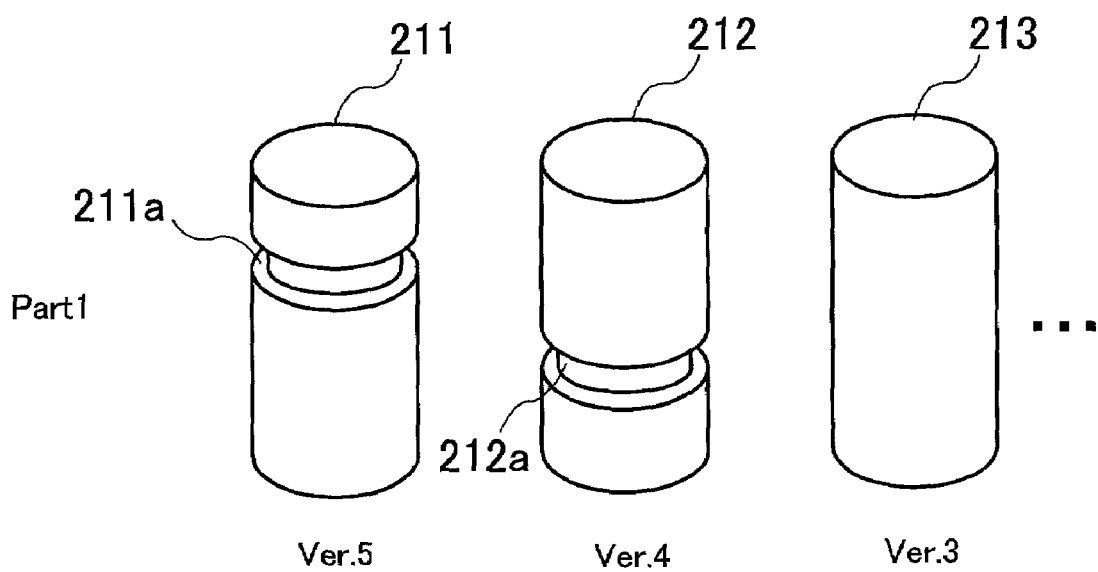

FIGS. 5(A), 5(B) and 5(C) schematically show examples of the shapes of the first part. FIG. 5(A) shows a part 211 defined by the parts data 131 of the fifth version. FIG. 5(B) shows a part 212 defined by parts data 132 of the fourth version. FIG. 5(C) shows a part 213 defined by the parts data 133 of the third version.

In these examples, the part 213 of the third version has a simple cylindrical shape, and the part 212 of the fourth version has a groove 212a formed in the circumferential surface. The part 211 of the fifth version has a groove 211a, which is formed in a position closer to the upper surface than the groove 212a.

Figures 6A, 6B:
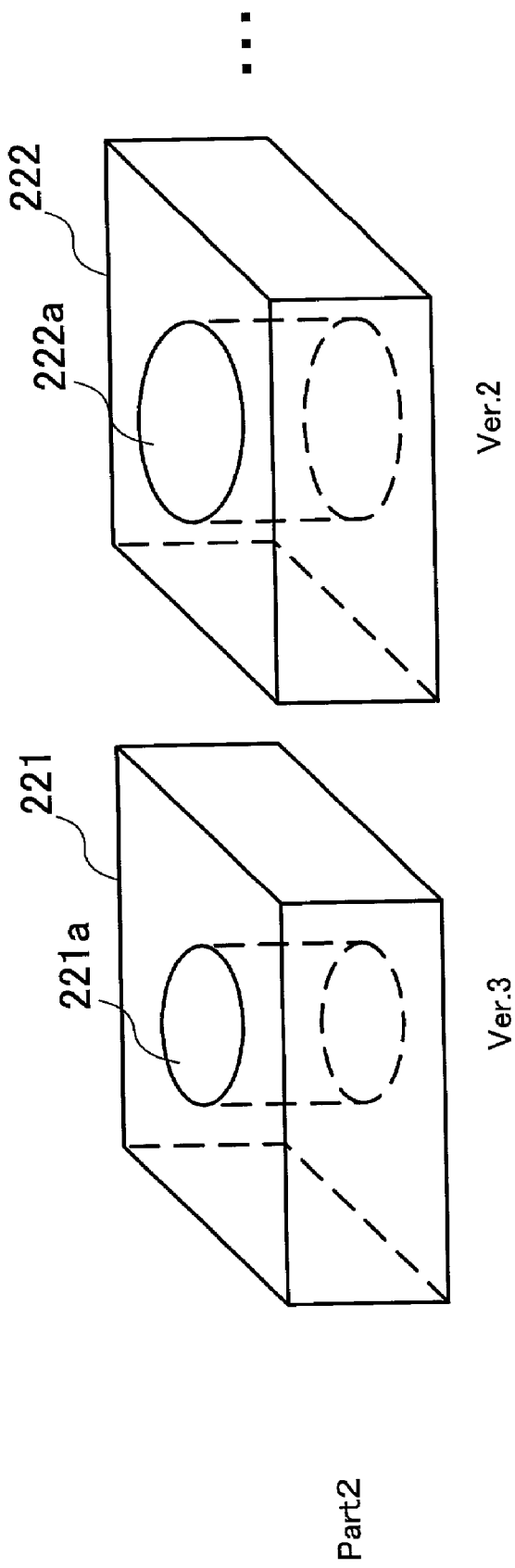

FIGS. 6(A) and 6(B) schematically show examples of the shapes of the second part. FIG. 6(A) shows a part 221 defined by the parts data 141 of the third version. FIG. 6(B) shows a part 222 defined by the parts data 142 of the second version.

In these examples, the part 222 of the second version has a rectangular parallelepiped, which is pierced by a hole 222a connecting the upper and lower surfaces. The part 221 of the third version has a through hole 221a having a diameter smaller than that of the through hole 222a.

By loading the above-mentioned three-dimensional CAD data, the structures of the assembly data can be displayed on the monitor. The three-dimensional CAD data can be loaded by, for example, designating a desired assembly on the display screen provided by the GUI 61 of the CAD data management unit 60 and then selecting a desired load command in connection with the designated assembly.

Figure 7:
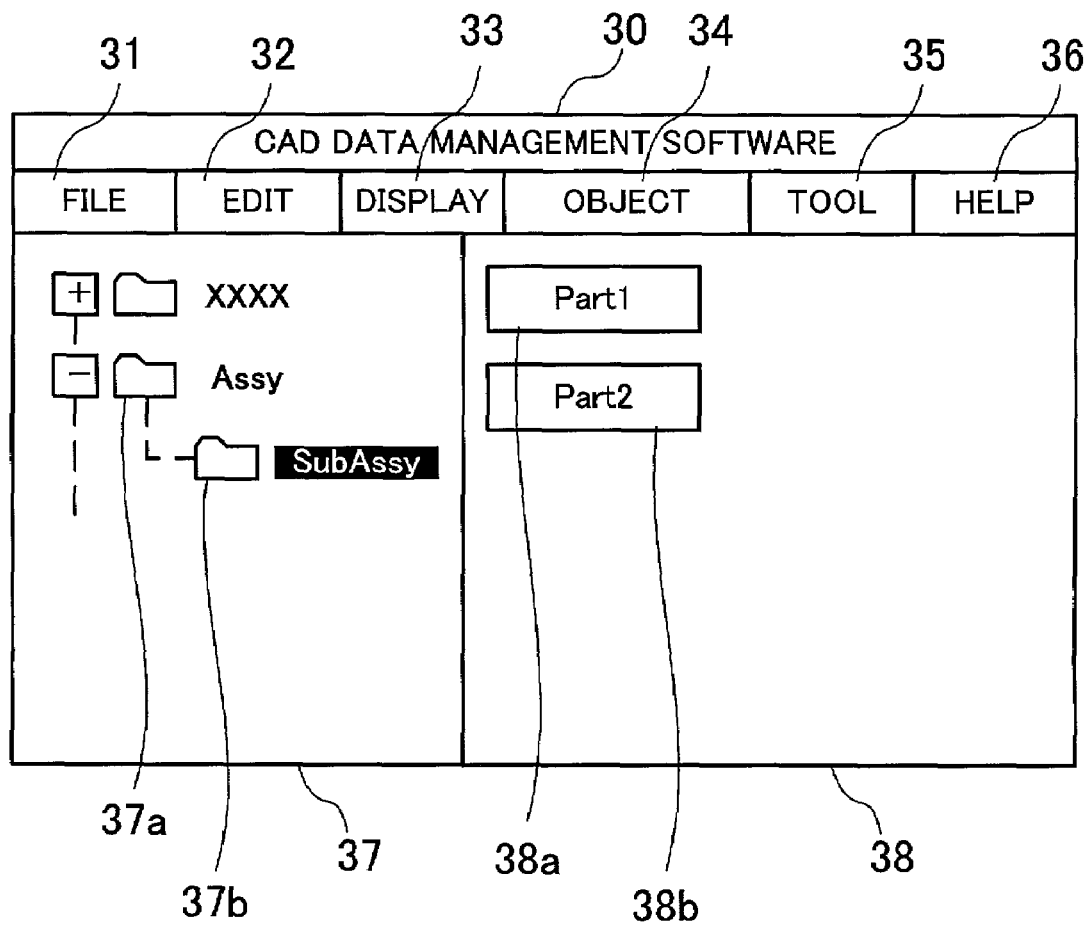
FIG. 7 is a view of a screen on which the structure of an assembly is displayed.

FIG. 7 is a view of a screen on which the structure of an assembly is displayed. A plurality of menus appear in an upper area on a display screen 30. A file menu 31 is used to, for example, load data. An edit menu 32 is used to, for example, make a copy of a file. A display menu 33 is used to, for example, designate the way to display items on the screen. An object menu 34 is used to, for example, enter the setting of taking sole possession of an object and the setting of releasing sole possession. The object is a structural element (unit, subunit, part) of the product defined by the CAD data. A tool menu 35 is used to, for example, customize the menu bar. A help menu 36 is used to, for example, turn on the help function such as a display of an online manual.

A data structure display area 37 is provided at the lower left side of the menu bar. The structure of data stored in the database 50 is displayed in the data structure display area 37. In the example shown in FIG. 7, the data structure display area 37 shows that a sub-assembly 37b named "SubAssy" is formed as a lower structure located under an assembly 37a named "Assy".

A data display area 38 is provided at the right side of the data structure display part 37. Data that forms the assembly selected on the data structure display area 37 is displayed in the data display area 38. In the example shown in FIG. 7, the sub-assembly 37b is selected on the data structure display area 37, and items 38a and 38b of parts data that form the assembly 37b are displayed in the data display area 38.

The structure of the CAD data as shown in FIG. 7 is displayed under the control of the data structure analyzing part 62 and the GUI 61 shown in FIG. 3. More particularly, the data structure analyzing part 62 analyzes the contents of the group 51 of CAD data stored in the database 50. The GUI 61 displays images on the display unit 80 on the basis of the tree structure of the CAD data analyzed by the data structure analyzing part 62, as shown in FIG. 7. In the above manner, the structure of CAD data can be displayed in the display unit 80.

The operator selects one or more objects specified in the CAD data displayed, and enters a data loading command. Thus, data of the selected object and data related thereto can be loaded. The data loading command can be entered by, for example, selecting a corresponding menu on the display screen 30 provided by the GUI 61 of the CAD data management unit 60.

Figure 8:
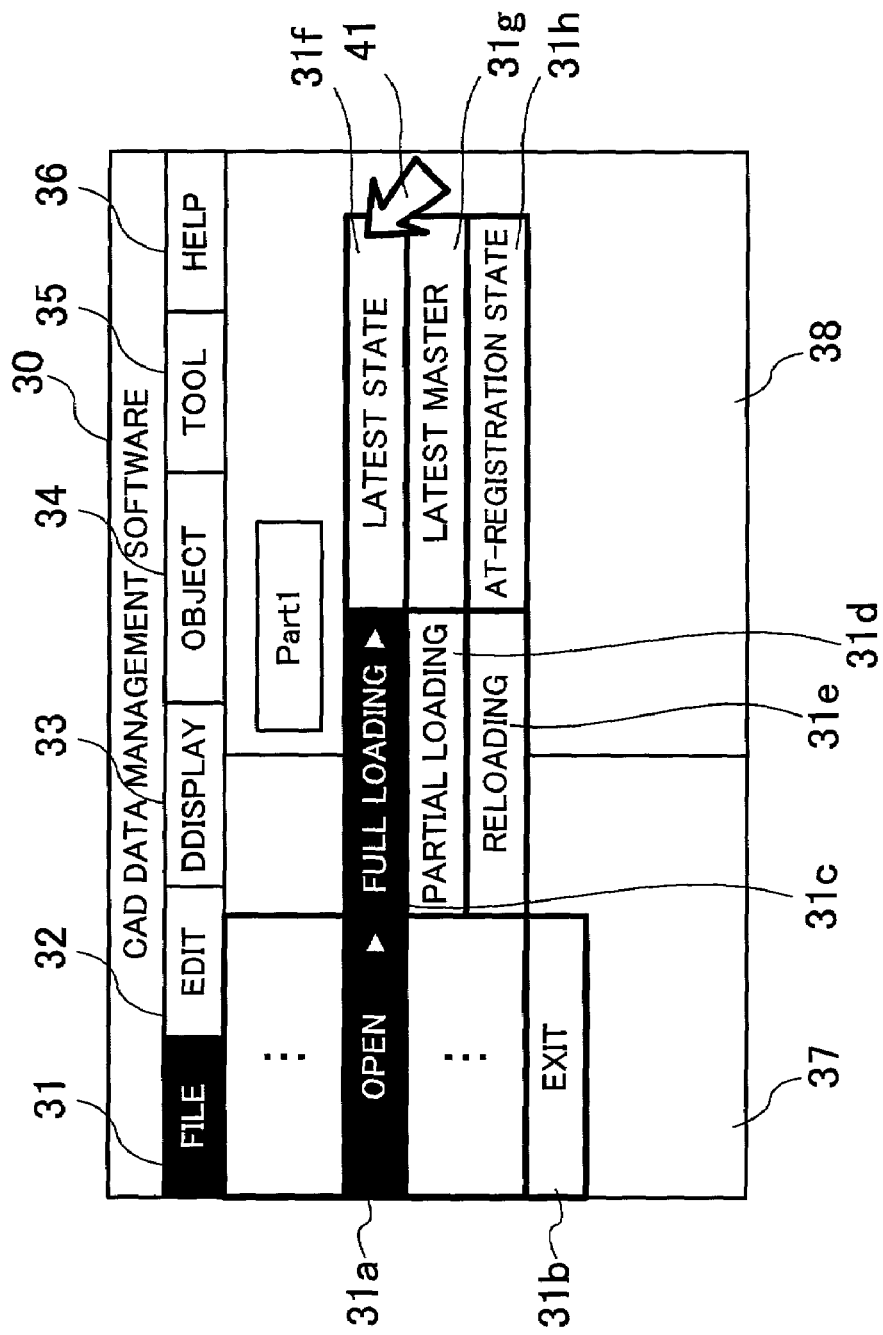
FIG. 8 is a view of a display screen used when CAD data is loaded.

FIG. 8 is a view of an display screen that is presented when CAD data is loaded. In this example, a mouse cursor 41 is moved by using a pointing device such as a mouse. Then, a desired command is selected so that a desired type of loading can be designated.

When the file menu 31 in the menu bar is selected, a pulldown menu that shows an open command 31a and an exit command 31b is displayed. The open command 31a is used to load CAD data. The exit command 31b is used to terminate the process of the CAD data management unit 60.

When the operator selects the open command 31a, a sub-menu for designating the type of loading is opened. The sub-menu includes a full loading command 31c, a partial loading command 31d, and a reloading command 31e.

The full loading command 31c is used to load all CAD data related to the selected assembly into the computer. For example, when the full loading command 31c is chosen in a state in which a sub-assembly has been selected, all CAD data of the product including the chosen sub-assembly is loaded into the computer. All CAD data of the product includes assembly data at the top level of the hierarchical arrangement, sub-assembly data and parts data under the assembly data at the top level.

The partial loading command 31d is used to load part of data of the product into the computer. For example, when the partial loading command 31d is selected in a state in which a sub-assembly has been designated, data of the selected sub-assembly and data having the lower structure located under the selected sub-assembly are loaded into the computer.

The reloading command 31e is used to load the latest version of data that is accessed for reference. For example, when a person responsible for design is in the act of displaying a shape of the parts using loaded parts data, an operator may modify the parts data and save the modified version thereof. When the person responsible for design selects the reloading command 31e, the parts data of the latest (updated) version is loaded and displayed on the screen.

When the full loading command 31c is selected, a sub-menu is displayed. The sub-menu includes a latest-state loading command 31f, a latest-master loading command 31g, and at-registration-state loading command 31h.

When the latest-state loading command 31f is selected, data of the latest version about an object to be loaded is loaded. When the latest-master loading command 31g is selected, data of the latest version selected from among the approved data about an object to be loaded is loaded. When the at-registration-state loading command 31h is selected, data of the version indicated in the at-registration-state information included in assembly data of an object to be loaded is loaded.

When the partial loading command 31d is selected, the same sub-menu as that displayed when the full loading command 31c is selected is displayed.

[Latest-State Load Process]

The details of the latest-state loading process are now described below. The following description assumes that assembly data, sub-assembly data and parts data are respectively stored in individual files, which are stored in the database 50.

Figure 9:
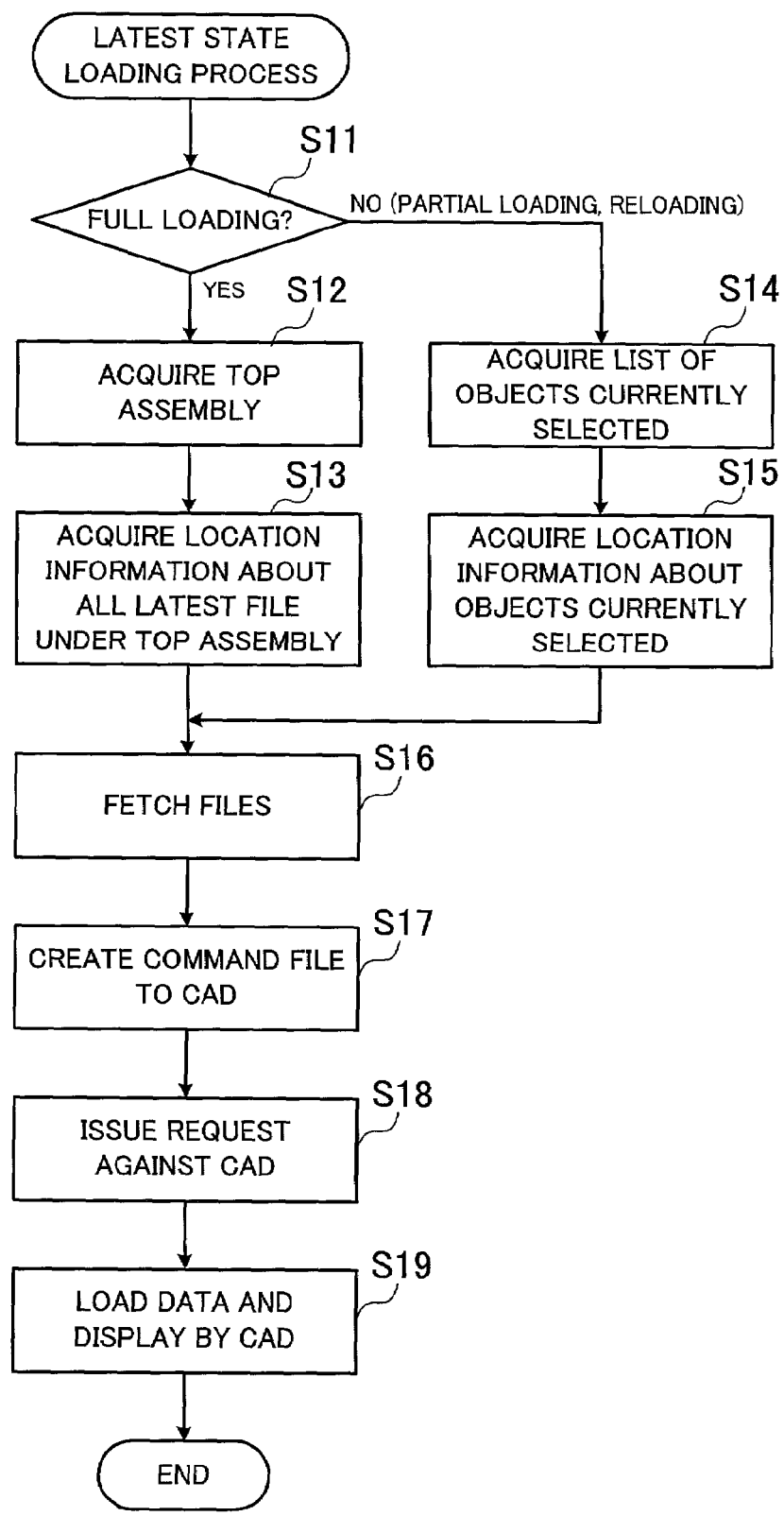
FIG. 9 is a flowchart of a sequence of a latest state loading process.

FIG. 9 is a flowchart of a sequence of the latest-state loading process. The latest-state loading process is described with reference to step numbers shown in FIG. 9.

[Step S11] The data loading management part 63 receives a loading command from the GUI 61, and determines whether the received loading command specifies the full loading. If the full loading is specified, the data loading management part 63 proceeds to step S12. In contrast, if the full loading is not specified (that is, the partial loading or reloading is specified), the data loading management part 63 proceeds to step S14.

[Step S12] The data loading management part 63 refers to the structure information 52 stored in the database 50, and acquires structure information about the top assembly of CAD data to which a selected object belongs. The top assembly is an assembly located at the top level of CAD data arranged hierarchically.

[Step S13] The data loading management part 63 refers to the structure information 52, and acquires file location information about the latest file of the top assembly acquired in step S12 and files under the top assembly. The file location information indicates where the target file is stored in the database 50. After finishing step S13, the data loading management part 63 executes step S16.

[Step S14] The data loading management part 63 refers to the structure information 52, and acquires a list of selected objects.

[Step S15] The data loading management part 63 refers to the structure information 52, and acquires file location information about the latest files of the selected objects and all latest files under the selected objects. Then, the data loading management part 63 proceeds to step S16.

[Step S16] The data loading management part 63 fetches the files from the database 50 on the basis of the file location information obtained in step S13 or S15.

[Step S17] The data loading management part 63 creates command files directed to the CAD processing parts 71 through 73. The command files created include information about a designation of a file to be loaded and the type of loading (full loading, partial loading or reloading).

[Step S18] The data loading management part 63 makes requests against the CAD processing parts 71 through 73. More particularly, a request to execute the command files created in step S17 is output to the CAD processing parts 71 through 73 that are associated with the files to be loaded. Each item of data stored in the database 50 is associated with the CAD processing part that handles the item of data by the data saving management part 64 at the time of saving the item of data to the database 50.

[Step S19] Each CAD processing part receives the request from the data loading management part 63, and loads the file fetched in step S16. Each CAD processing part controls the display unit 80 to display an image that depends on the type of loading.

In the above-mentioned manner, the latest states of the assemblies can be loaded into the computer.

Figure 10:
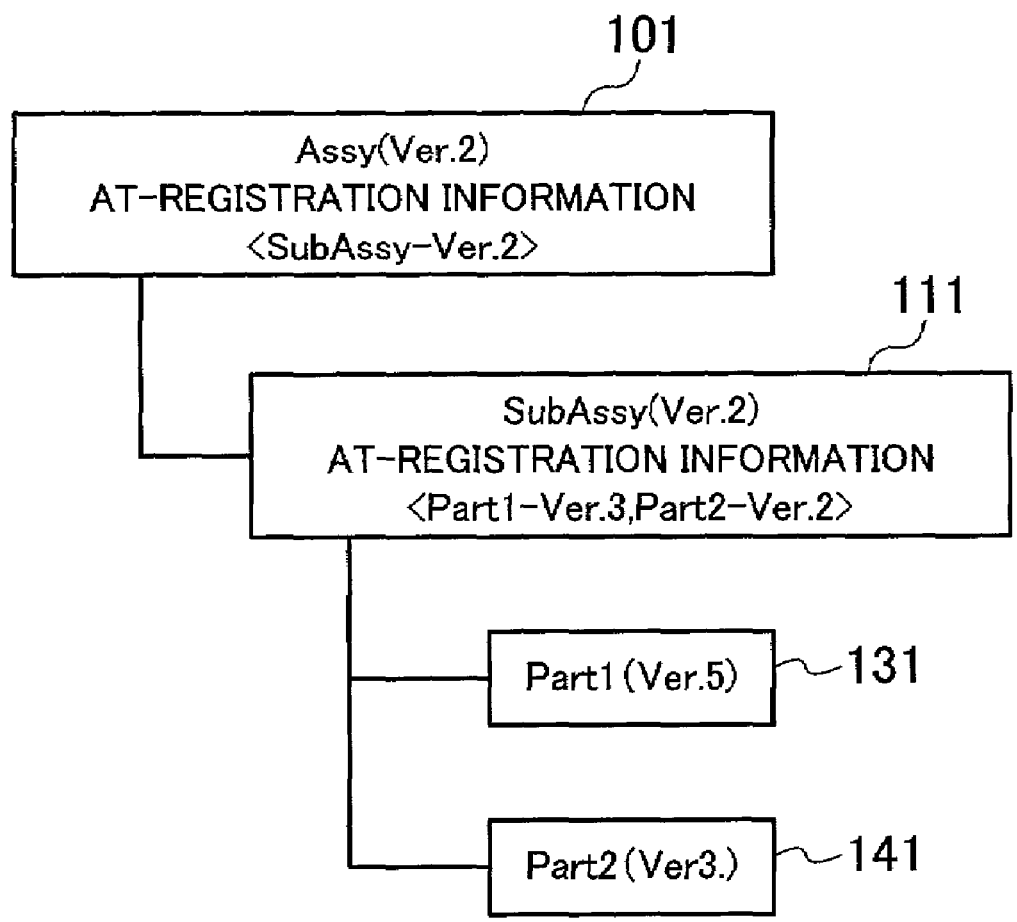
FIG. 10 illustrates an example of data loaded by the latest state loading process.
Figure 11:
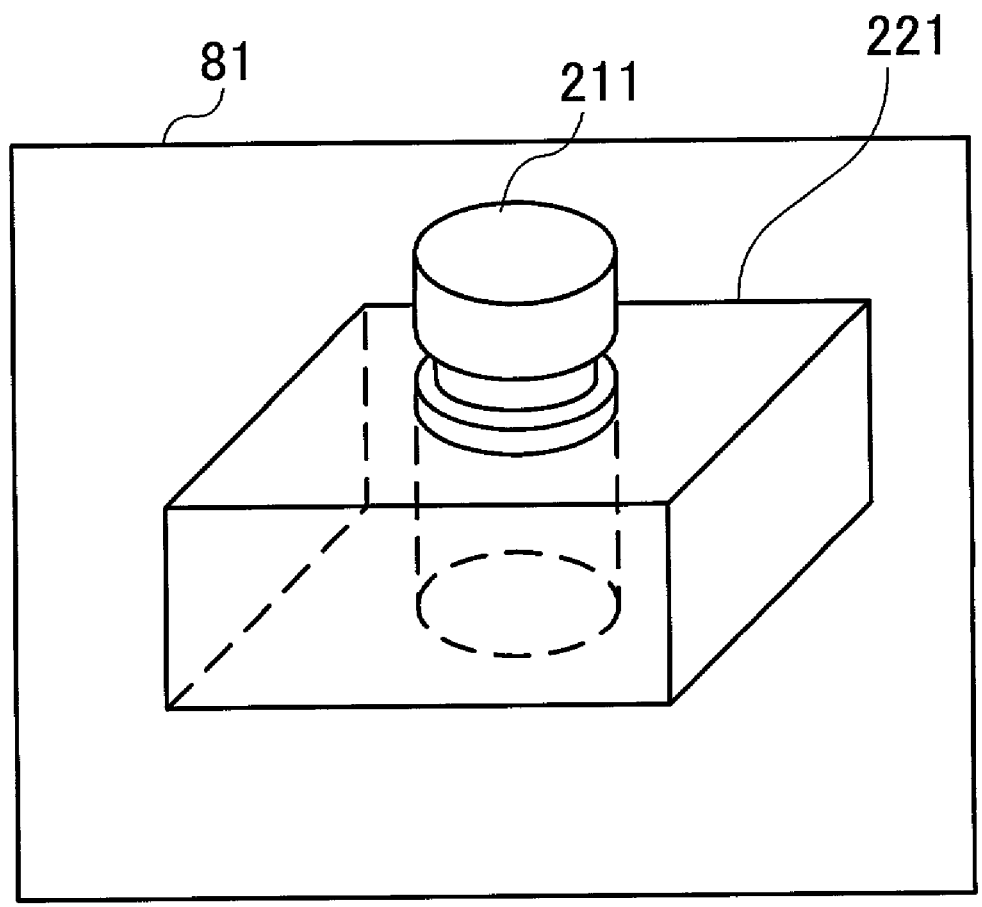
FIG. 11 is a view of a screen displayed by the latest state loading process.

FIG. 10 shows an example of data that is loaded by the latest-state loading process. FIG. 10 shows a case where the latest state of the CAD data having the structure shown in FIG. 4 is fully loaded. As shown in FIG. 10, the latest-state loading process loads the files (data) of the latest versions of the objects. As to the top assembly, the sub-assembly data 101 of the second version is loaded. As to the sub-assembly, the sub-assembly data 111 of the second version is loaded. As to the first part, the parts data 131 of the fifth version is loaded. As to the second part, the parts data 141 of the third version is loaded. FIG. 11 is a view of a screen displayed by the latest-state loading process. The example shown in FIG. 11 is a screen 81 made by using the loaded data shown in FIG. 10. On the screen 81, displayed are the part 211 based on the parts data 131 of the fifth version about the first part, and the part 221 based on the parts data 141 of the third version about the second part.

The part 211 is inserted into the hole formed in the part 221. The relationship in position between the parts 211 and 221 is defined in the sub-assembly data 111.

[At-Registration State Loading Process]

The at-registration-state loading process is now described below.

Figure 12:
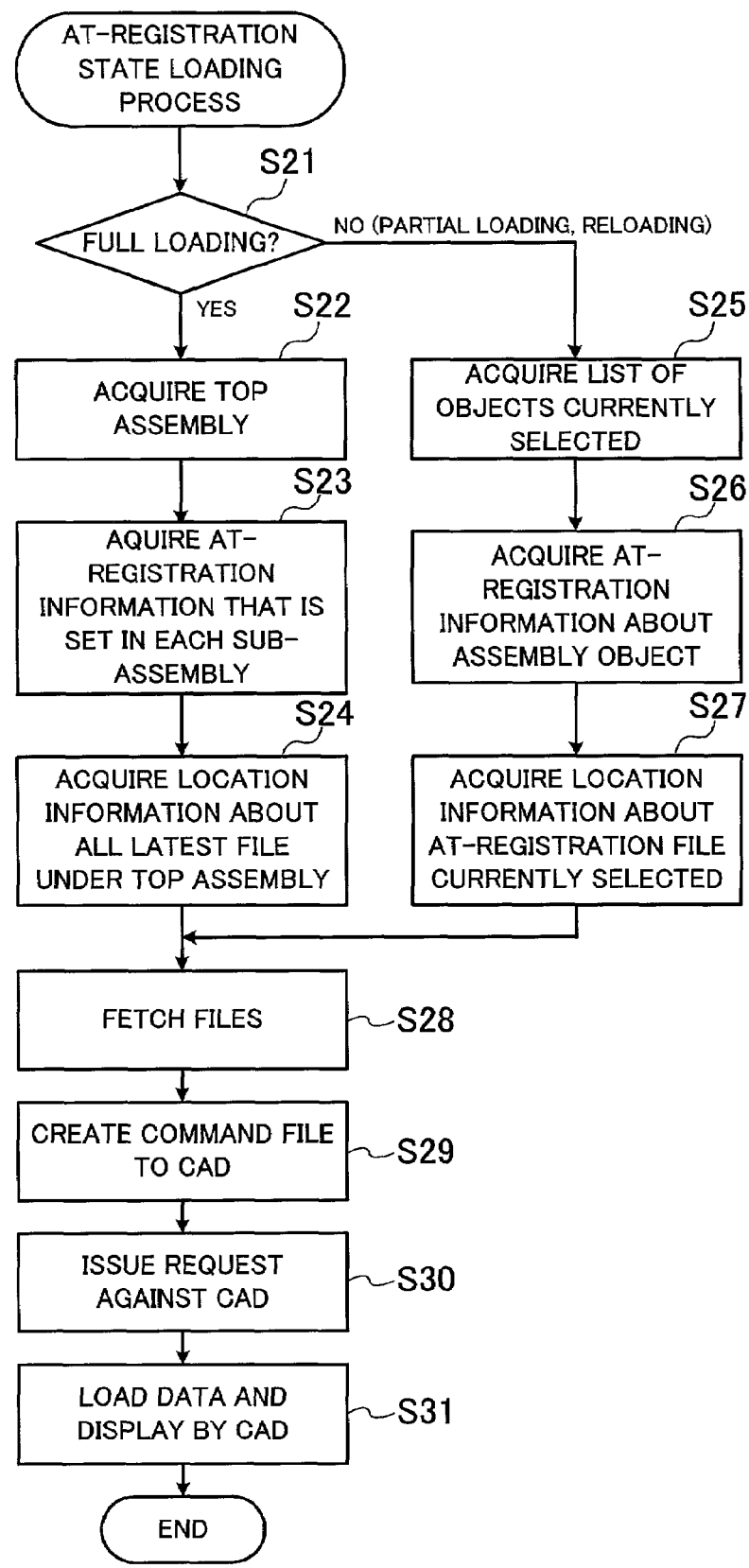
FIG. 12 is a flowchart of a sequence of an at-registration state loading process.

FIG. 12 is a flowchart of a sequence of the at-registration-state loading process. This process is described with reference to step numbers shown in FIG. 12.

[Step S21] The data loading management part 63 receives the loading command from the GUI 61, and determines whether the received loading command specifies the full loading. If the full loading is specified, the data loading management part 63 proceeds to step S22. In contrast, if the full loading is not specified (that is, partial loading or reloading is specified), the data loading management part 63 proceeds to step S25.

[Step S22] The data loading management part 63 refers to the structure information 52 stored in the database 50, and acquires structure information (including at-registration information) about the top assembly of CAD data to which a selected object belongs.

[Step S23] The data loading management part 63 refers to the structure information 52, and acquires at-registration information that is set in each sub-assembly (files of the versions indicated in the at-registration information) under the acquired top assembly.

[Step S24] The data loading management part 63 acquires location information about all at-registration files of objects under the top assembly. An at-registration file is a file of the version indicated by the at-registration information. After finishing this step, the data loading management part 63 proceeds to step S28.

[Step S25] The data loading management part 63 refers to the structure information 52, and acquires a list of the selected objects.

[Step S26] The data loading management part 63 acquires the at-registration information about the selected assembly objects and assembly objects under the selected objects.

[Step S27] The data loading management part 63 refers to the structure information 52, and acquires location information about the at-registration files under the selected objects. After finishing this step, the data loading management part 63 proceeds to step S28.

[Step S28] The data loading management part 63 fetches files from the database 50 on the basis of the location information acquired in step S24 or step S27.

[Step S29] The data loading management part 63 creates command files directed to the CAD processing parts 71 through 73. The command files thus created include information about a designation of a file to be loaded and the type of loading (full loading, partial loading or reloading).

[Step S30] The data loading management part 63 makes requests against the CAD processing parts 71 through 73. More particularly, a request for execution of the command files created in step S29 is output to the CAD processing parts 71 through 73 that are associated with the files to be loaded.

[Step S31] Each CAD processing part receives the request from the data loading management part 63, and loads the file fetched in step S28. Each CAD processing part controls the display unit 80 to display an image that depends on the type of loading.

In the above-mentioned manner, the at-registration states of the assemblies can be loaded into the computer.

Figure 13:
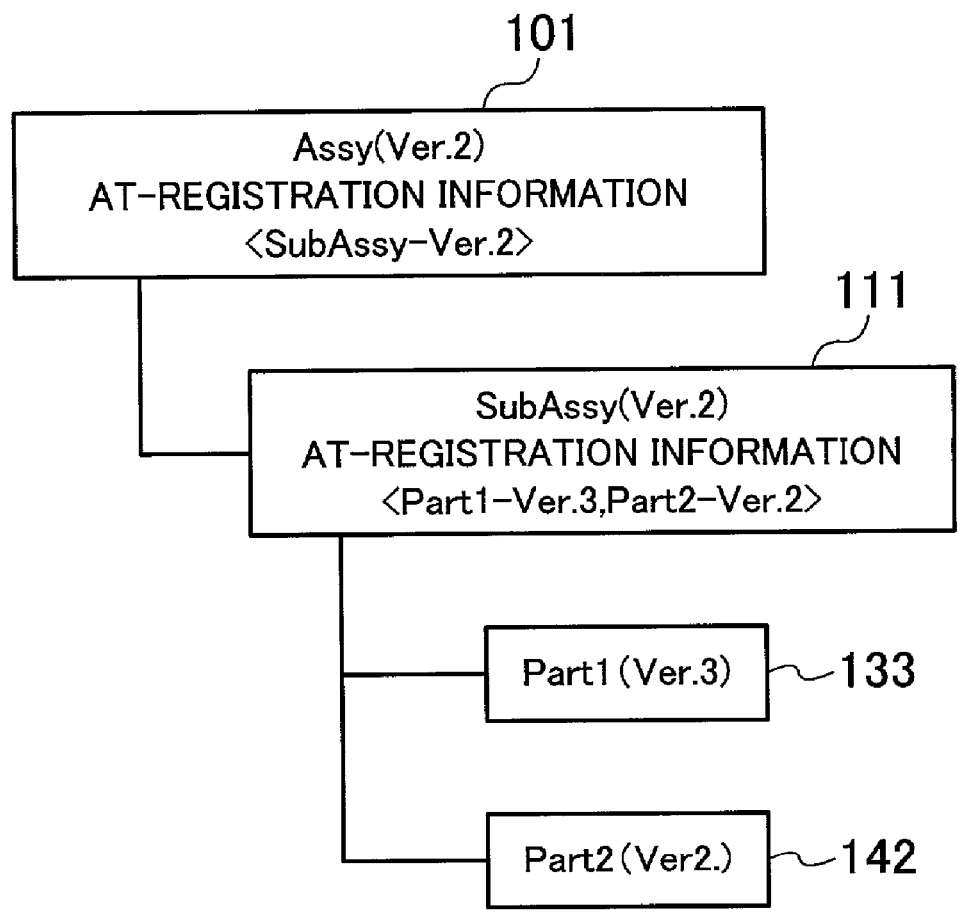
FIG. 13 illustrates an example of data loaded by the at-registration state loading process.

FIG. 13 shows an example of data that has been loaded by the at-registration-state loading process. FIG. 13 shows a case where the at-registration state of the CAD data having the structure shown in FIG. 4 is fully loaded. As shown in FIG. 13, the at-registration-state loading process loads the files (data) of the versions that are set in the at-registration information about each assembly. As to the top assembly, the assembly data 101 of the second version is loaded. As to the sub-assembly, the sub-assembly data 111 of the second version is loaded. As to the first part, the parts data 133 of the third version is loaded. As to the second part, the parts data 142 of the second version is loaded.

Figure 14:
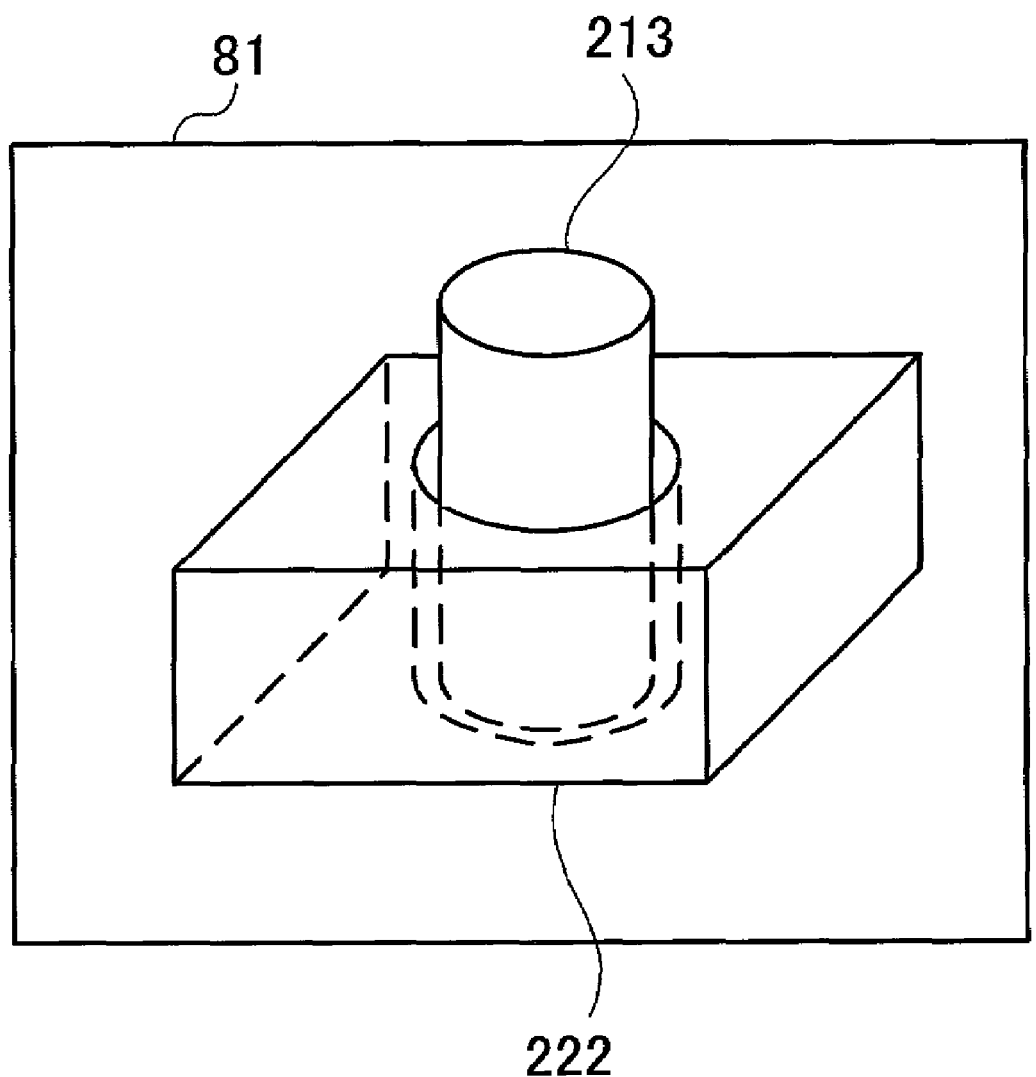
FIG. 14 is a view of an image displayed by the at-registration state loading process.

FIG. 14 is a view of an image displayed by the at-registration-state loading process. This example is an image displayed by using the loaded data shown in FIG. 13. On the screen 81, displayed are the part 213 based on the parts data 133 of the third version about the first part, and the part 222 based on the parts data 142 of the second version about the second part.

The part 213 is inserted into the hole formed in the part 222. The part 222 has a diameter greater than that of the part 213. This difference makes a gap between the part 213 and the hole of the part 222.

In the above-mentioned manners, the operator can obtain CAD data of the latest version and that of the version at registration. When CAD data of the at-registration version is loaded, the operator can reconfirm the structure that was confirmed in the past on the screen.

[Saving Process]

After the files of the latest states are loaded and saved by the CAD processing parts, the data saving management part 64 updates information about the at-registration state of the involved assembly.

Figure 15:
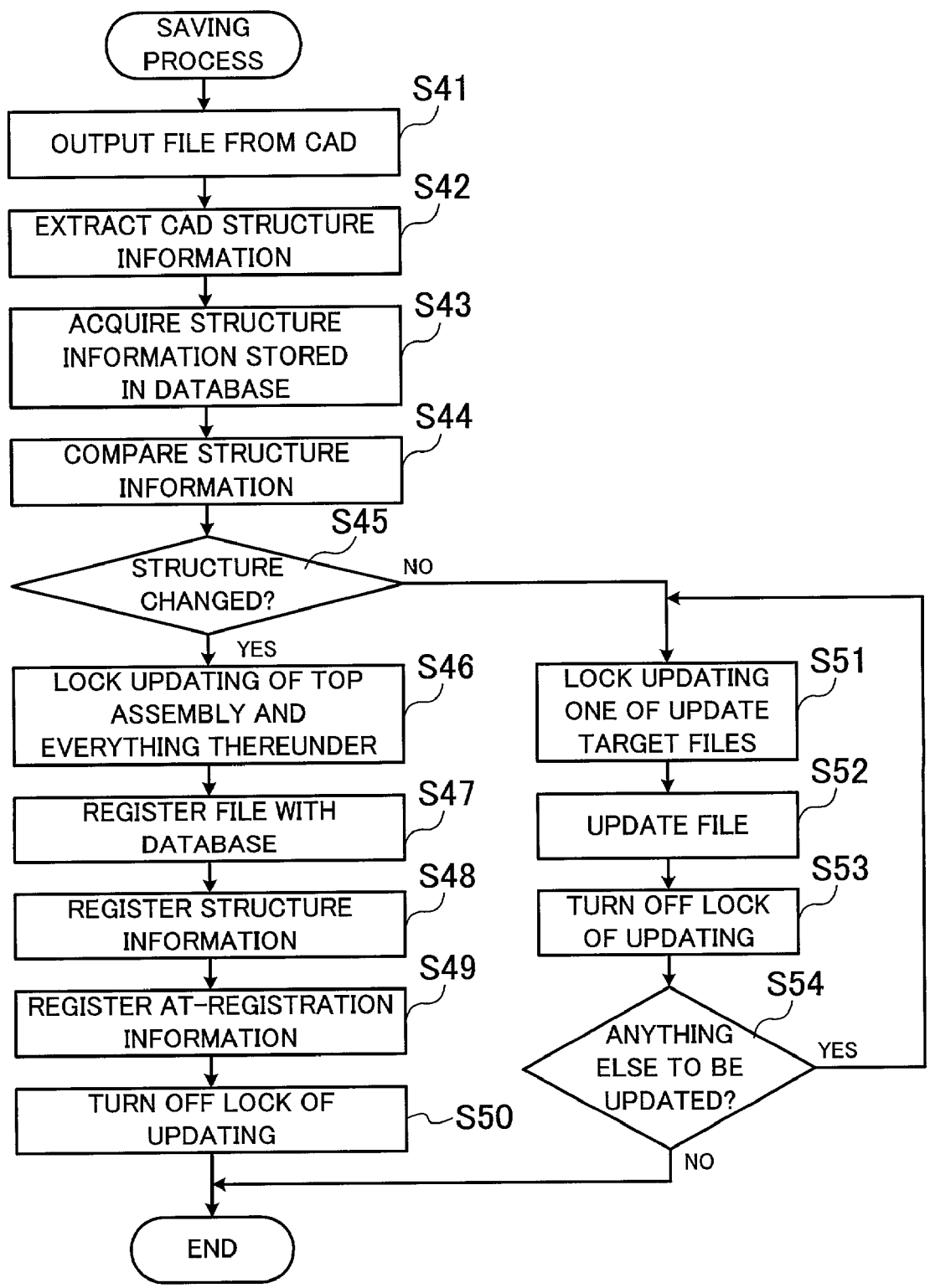
FIG. 15 is a flowchart of a sequence of a saving process.

FIG. 15 is a flowchart of a sequence of the save process. This process is described with reference to step numbers shown in FIG. 15.

[Step S41] The CAD processing part, which is one of the CAD processing part 71 through 73, outputs a file to be saved.

[Step S42] The data saving management part 64 extracts the structure information about the file that is output by the CAD processing part.

[Step S43] The data saving management part 64 acquires, from the structure information 52 stored in the database 50, the structure information about the file that is output by if the CAD processing part.

[Step S44] The data saving management part 64 compares the structure information extracted in step S42 with the structure information acquired in step S43.

[Step S45] It is determined, from the comparison result obtained in step S44, whether there is a change in the structure. If it is determined that there is a change in the structure, the process proceeds to step S46. In contrast, if it is determined that there is no change in the structure, the process proceeds to step S51.

[Step S46] The data saving management part 64 performs an update locking process for the file of the top assembly and each file under the top assembly. The update locking process prevents a process other than the process (CAD processing part) that executes the update locking process from updating the contents of the file involved in the present saving process. The update locking process prevents a plurality of processes from simultaneously executing the process of saving a single file.

[Step S47] The CAD processing part registers the file with the database 50.

[Step S48] The data saving management part 64 registers the structure information about the file registered in step S47 in the structure information 52 stored in the database 50.

[Step S49] The data saving management part 64 registers the at-registration information about the file registered in step S47 in addition to the structure information registered in step S48.

[Step S50] The data saving management part 64 turns off the lock of updating. Then, the process ends.

[Step S51] The data saving management part 64 sets the lock of updating to one of the update target files.

[Step S52] The CAD processing part updates the file.

[Step S53] The data saving management part 64 releases the update target file from the locked state.

[Step S54] The data saving management part 64 determines whether there is anything else to be updated. If the answer is YES, the process returns to step S51. Otherwise, the process ends.

An example of updating the at-registration information is described below. By way of example, it is assumed that the latest state (shown in FIG. 10) of the CAD data having the structure shown in FIG. 4 is loaded and saved. As shown in FIG. 10, the latest version of the parts data 131 of the first part in the sub-assembly data 111 is the fifth version. The latest version of the parts data 141 of the second part in the sub-assembly data 111 is the third version. The at-registration information registered in the sub-assembly data 111 indicates that the third version of the first part was at registration and the second version of the second part was at registration.

The situation in which the latest state shown in FIG. 10 is loaded and is displayed as shown in FIG. 11 means that the assembly structure of the latest state has been confirmed by the operator. Thus, the state of the assembly structure newly confirmed now becomes the at-registration state. Therefore, the at-registration information about the assembly data is updated on the basis of the above at-registration information.

Figure 16:
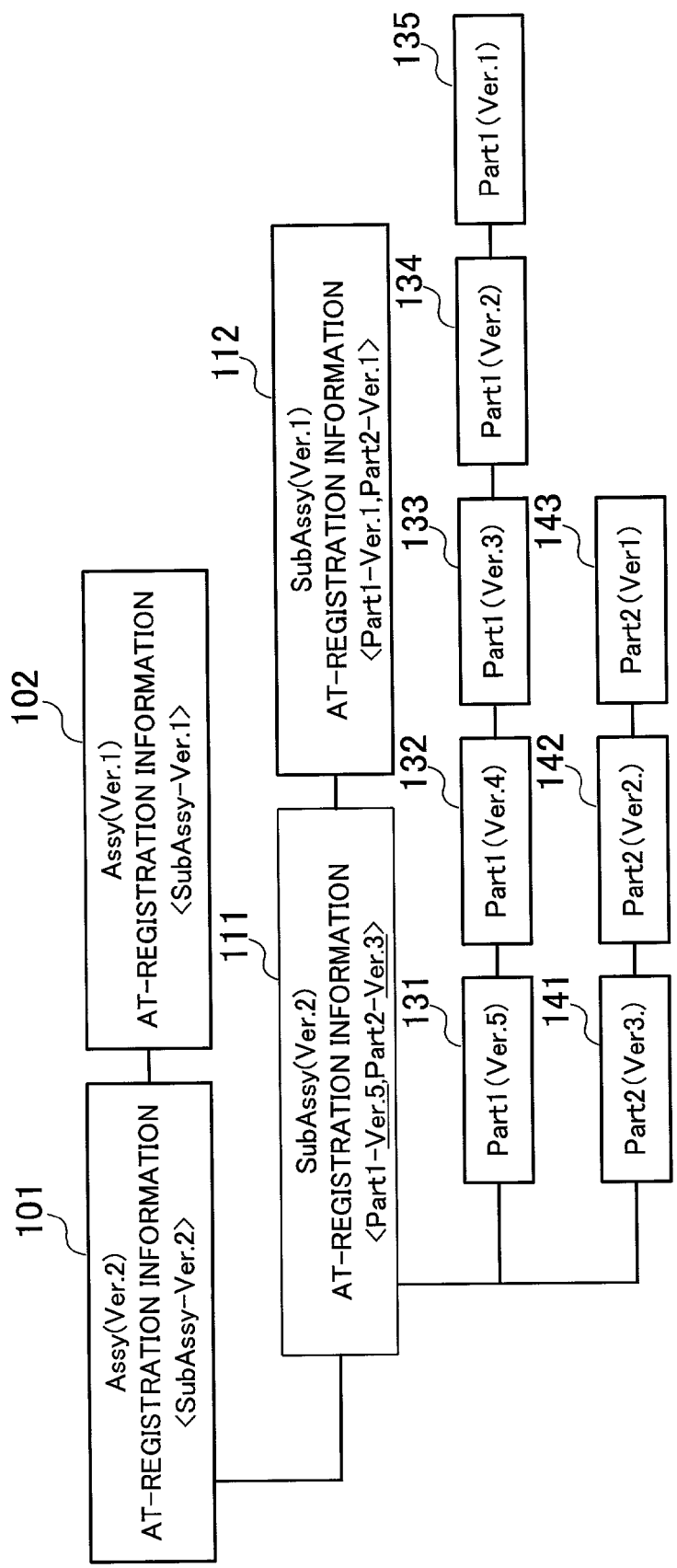
FIG. 16 illustrates a structure of CAD data that has been updated.

FIG. 16 is a diagram of a structure of updated CAD data. As compared with the structure before updating shown in FIG. 4, only the at-registration information about the sub-assembly data 111 of the second version has been changed (the updated items of at-registration information are underlined). In the sub-assembly data 111 after updating, the parts data 131 of the fifth version of the first part and the parts data 141 of the third version of the second part are registered as at-registration information.

In the above-mentioned manner, the CAD data of the latest state is loaded and saved, so that the at-registration information can be updated. [Approval Request Process]

An approval request process is described below. The approval request process is used for a case where a product is designed by a group of designers, and asks a person who has the right to decide that the design drawings of the product are acknowledged to be formal to approve CAD data. The approval request process selects an object (assembly or parts) that is asked for approval, and enters an approval request command in the computer. The approval request command can be entered in such a manner that the operator designates the approval request command in the pulldown menu displayed on the screen. When the approval request command is entered, the computer executes the approval request process.

Figure 17:
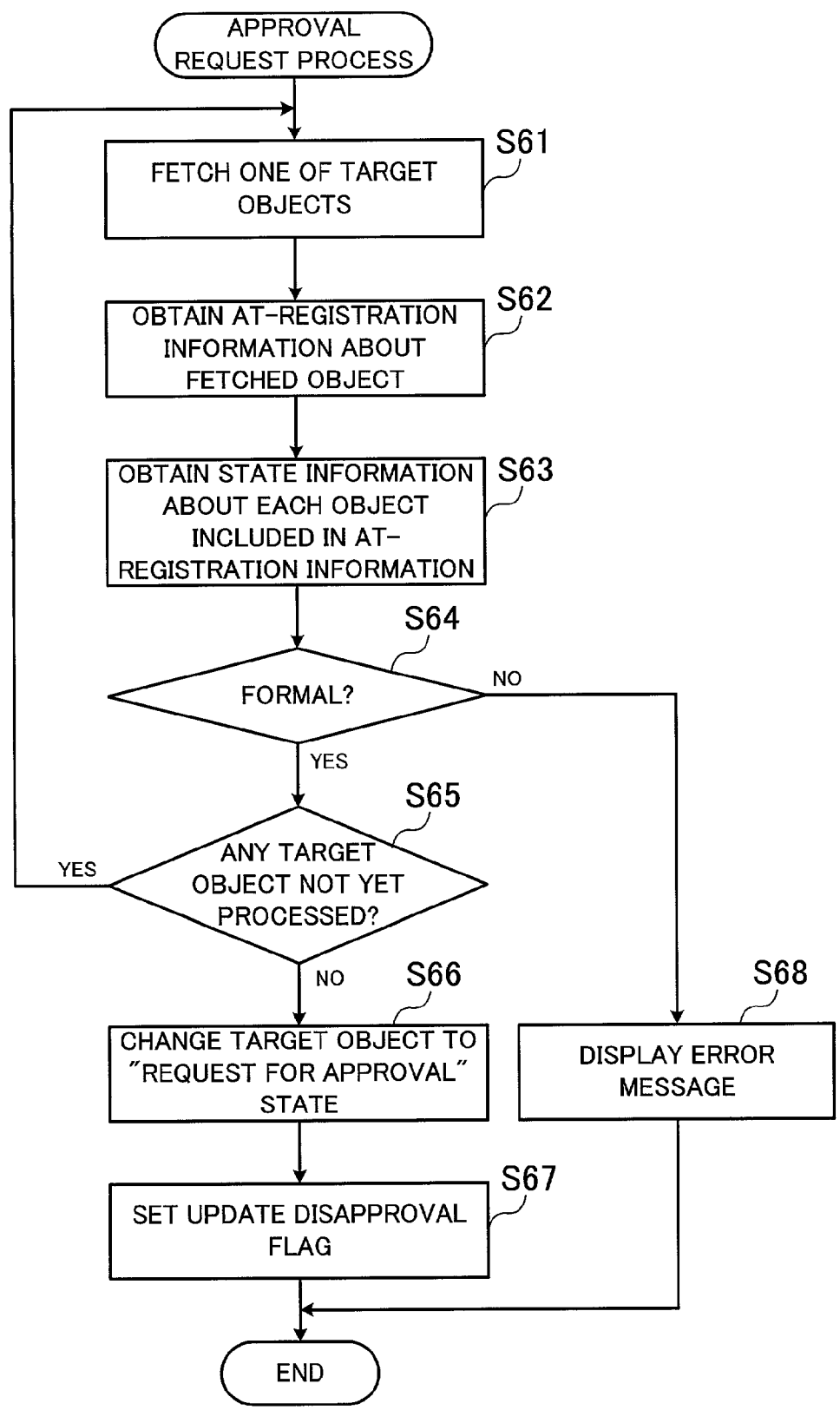
FIG. 17 is a flowchart of a sequence of an approval request process.

FIG. 17 is a flowchart of a sequence of the approval request process. This step is described with reference to step numbers shown in FIG. 17.

[Step S61] The approval processing part 65 fetches one file of an object which is the target for the approval request (target object) from the database 50. The target object is an object that is selected when the approval request command is entered. An example of the target object is an assembly object or a parts object.

[Step S62] The approval processing part 65 refers to the structure information 52, and obtains the at-registration information of the target object fetched in step S61.

[Step S63] The approval processing part 65 obtains state information about each object included in the at-registration information fetched in step S62.

The state information indicates the progress of the work for the object. Examples of the state information are "in progress", "request for approval" and "approved". State information "in progress" shows that the operator has not finished his/her design work. State information "request for approval" shows that the operator waits for approval or disapproval made by the responsible person. State information "approved" shows that the responsible person has acknowledged the corresponding CAD data to be formal.

[Step S64] The approval processing part 65 determines whether the target object is formal data on the basis of the state information fetched in step S63. The formal data satisfies a requirement such that all the items of data of the versions indicated by the at-registration information have been "approved". The process proceeds to step S65 if the answer is YES. Otherwise, the process proceeds to step S68.

[Step S65] The approval processing part 65 determines whether there is a target object that has not yet been processed. The process proceeds to step S61 if the answer is YES. Otherwise, the process proceeds to step S66.

[Step S66] The approval processing part 65 changes each target object to the "request for approval" state.

[Step S67] The approval processing part 65 sets an update disapproval flag to each target object. The contents of each target object in the approval request state cannot be updated unless the update disapproval flag is turned off. Then, the process ends.

[Step S68] The approval processing part 65 causes an error message to be displayed on the display unit 80. For example, a message such that "there is an object that has not been approved". Then, the process ends.

In the above-mentioned manner, the approval request is made using the data of the version based on the at-registration information. It is therefore possible to prevent the approval request based on data of a version that has not been confirmed by the person who makes the request from being made. Further, the approval request cannot be made unless data of the at-registration version about an object lower than the designated object (target object). This prevents the approval request for an assembly including parts that have not been approved from being made.

[Approval Process]

A person who has the right to give approval to a product and an assembly can enter approval/disapproval for an object asked for approval via the GUI 61 of the CAD data management unit 60. The responsible person who has power of approval selects an object asked for approval and enters an approval command. For example, the approval command is displayed in the toolbar on the screen. When the approval command is selected using the mouse, the approval command is input to the computer. The computer receives the approval command and starts to execute the approval process.

Figure 18:
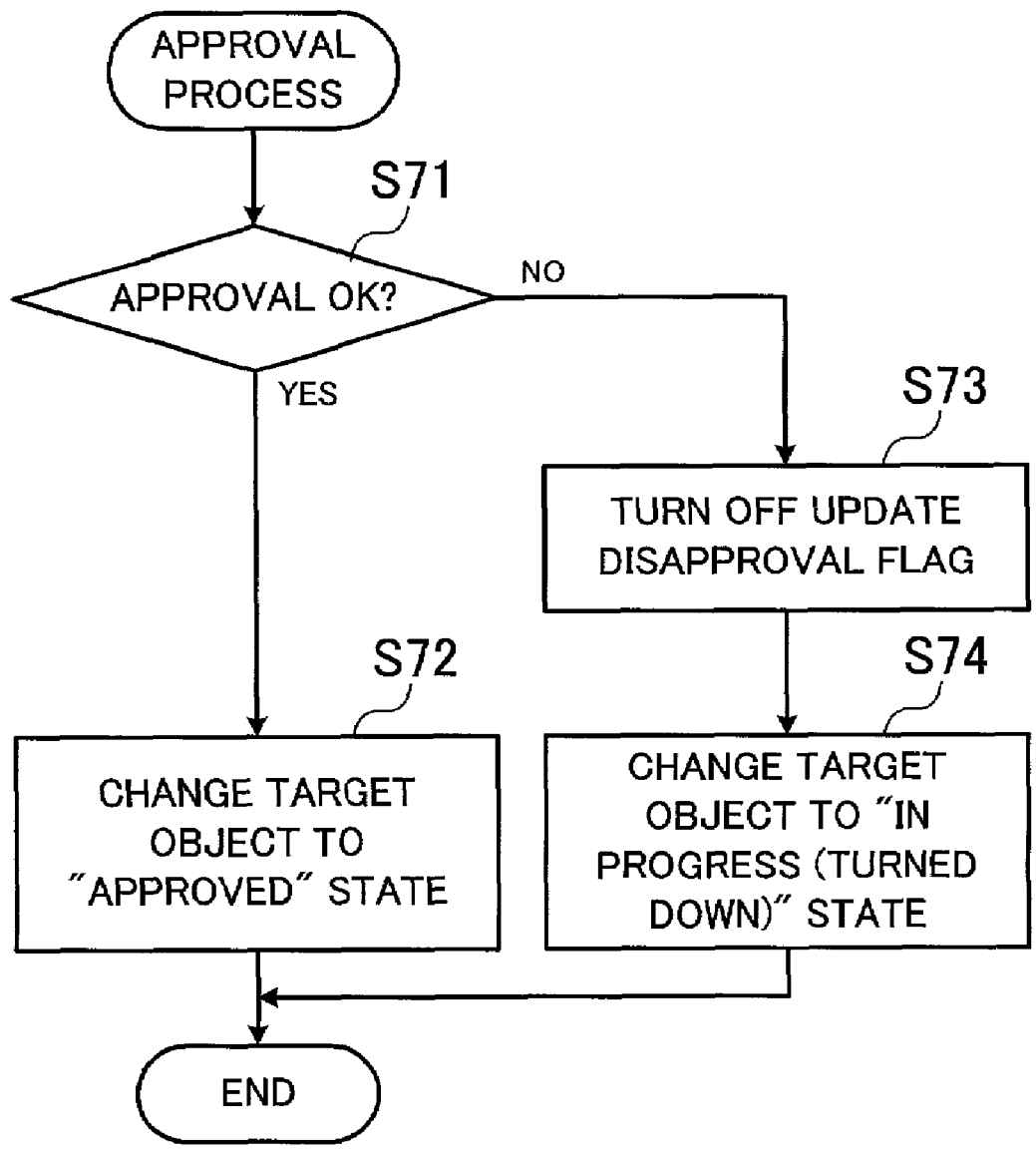
FIG. 18 is a flowchart of a sequence of an approval process.

FIG. 18 is a flowchart of a sequence of the approval process. This process is described with reference to the step numbers shown in FIG. 18.

[Step S71] The approval processing part 65 determines whether the input command is a command indicative of approval. If the input command is the approval command, the process proceeds to step S72. In contrast, if the input command is not the approval command (the approval request is turned down), the process proceeds to step S73.

[Step S72] The approval processing part 65 changes the target object (that is the object selected when the approval command is entered) to an "approved" state, and ends the process. In the case where the target object is approved, the update disapproval flag of the target object is not turned off.

[Step S73] The approval processing part 65 turns off the update disapproval flag of the target object.

[Step S74] The approval processing part 65 changes the target object to an "in progress (turned down)" state, and ends the process.

In the above-mentioned manner, it is possible to make the setting of approval/disapproval of the object asked for approval. If the approval request is turned down, the target object is set to the "in progress" state.

As described above, the present embodiment of the invention assigns at-registration information to assembly data. This makes it possible for the operator to easily reproduce the state of data at the time of the last registration (save) process on the CAD performed by the operator. In addition, even after parts data is changed by a person who is in charge of the parts, another operator can reconfirm the state of data that was registered (saved) for himself/herself.

[Example of Application]

An application of the present embodiment is described below.

[Exception Handling of Updating of At-registration Information]

The present embodiment has the partial loading in addition to the full loading. In the partial loading, data of the selected object (assembly or part) and data of an object under the selected object are loaded. Thus, in the partial loading, only some objects of the entire structure of the product may be loaded. If there is an object that is located under the top assembly and is not loaded, the at-registration information about the corresponding sub-assembly and parts that are not loaded will be made not to be updated.

An example of the exception handling of updating the at-registration information is described below.

Figure 19:
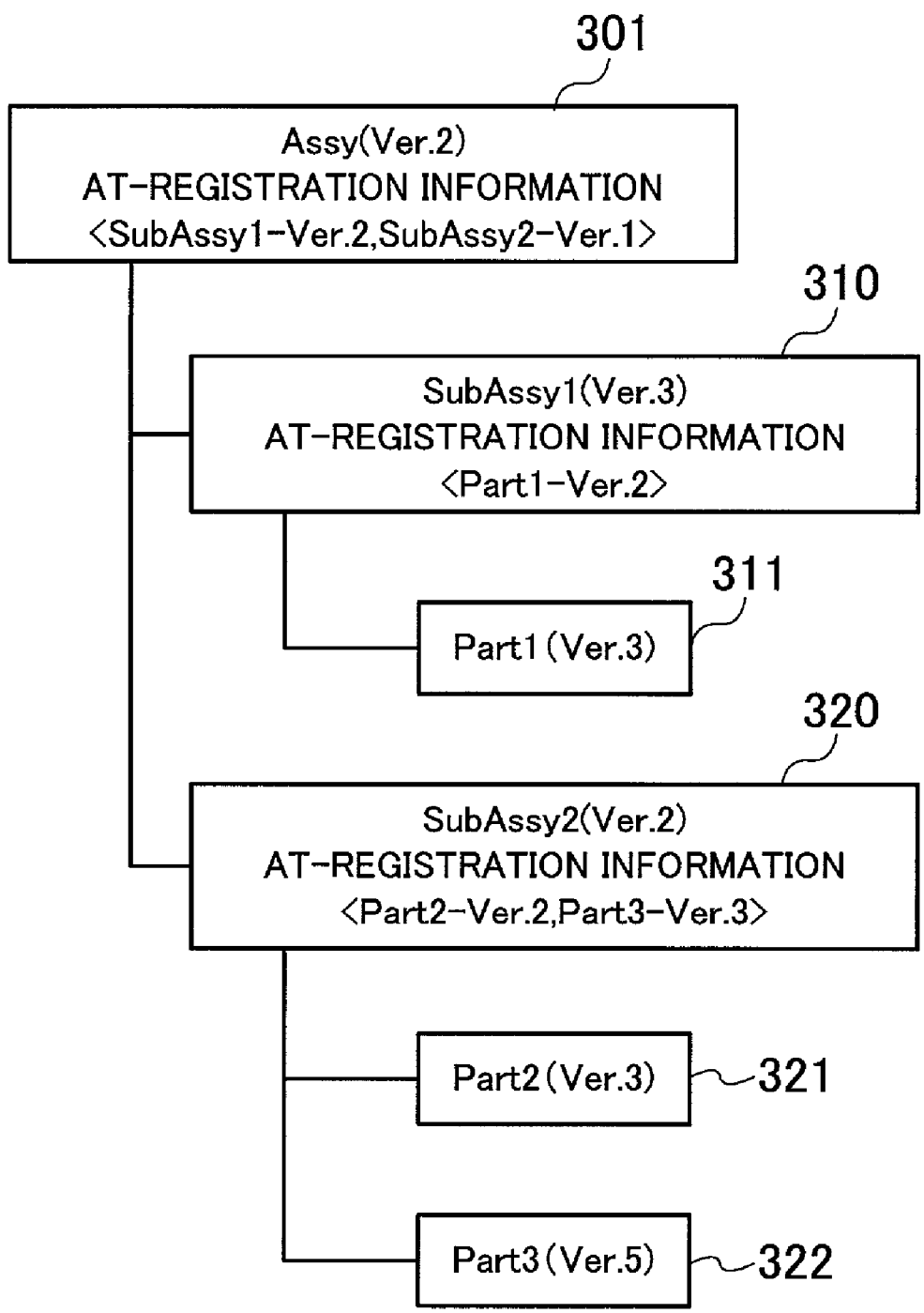
FIG. 19 illustrates a data structure that has two assemblies.

FIG. 19 is a diagram of a data structure having two sub-assemblies. FIG. 19 shows only items of data of the latest versions. In the example in FIG. 19, there are provided two items 310 and 320 of sub-assembly data that are located under data 301 of the top assembly. Parts data 311 about the first part is provided under the sub-assembly data 310. Parts data 321 about the second part and parts data 322 about the third part are provided under the sub-assembly data 320.

The latest version of the top-assembly data 301 is the second version. The top-assembly data 301 includes at-registration information <SubAssy1-Ver.2, SubAssy2-Ver.1>. The latest version of the sub-assembly data 310 is the third version. The sub-assembly data 310 includes at-registration information <Part1-Ver.2>. The latest version of the parts data 311 of the first part is the third version. The latest version of the sub-assembly data 320 is the second version. The sub-assembly data 320 includes at-registration information <Part2-Ver.2, Part3-Ver.3>. The latest version of the parts data 321 of the second part is the third version. The latest version of the parts data 322 of the third part is the fifth version.

A description will now be given of a case where the sub-assembly data 310 is designated and the partial loading is performed.

Figure 20:
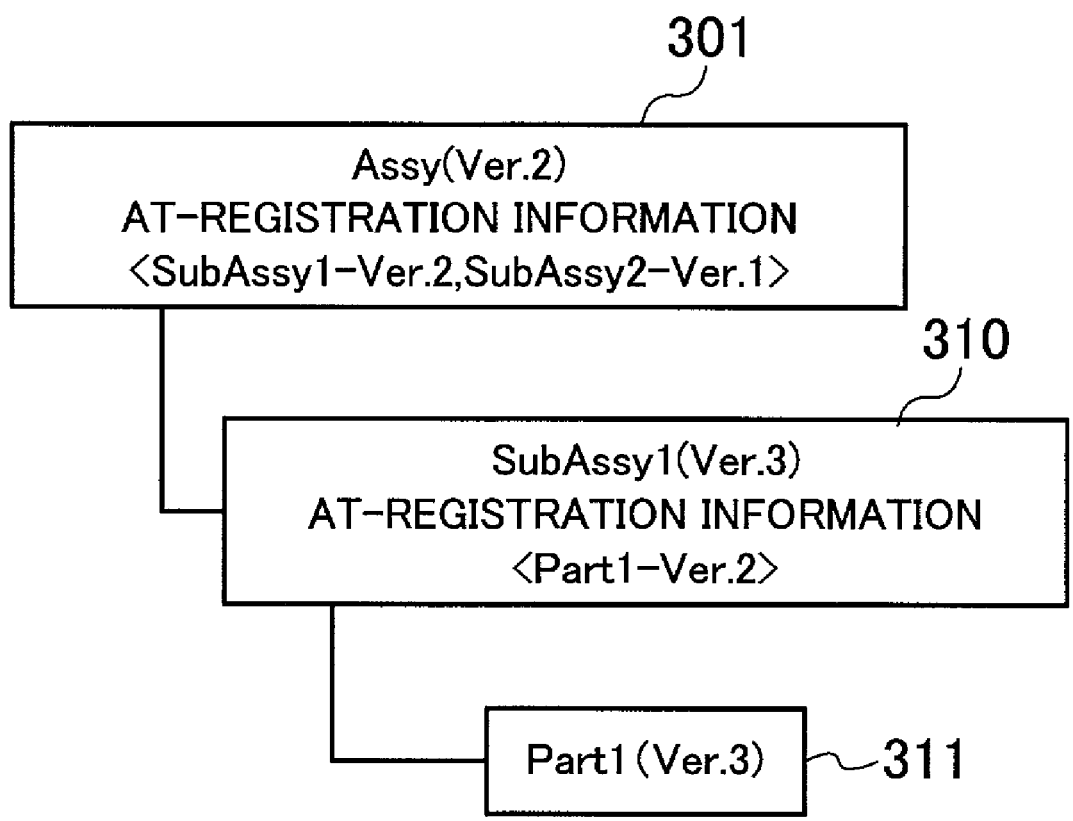
FIG. 20 illustrates loaded data obtained by partial loading based on the data structure shown in FIG. 19.

FIG. 20 shows loaded data obtained by the partial loading based on the data structure shown in FIG. 19. As shown in FIG. 20, the partial loading loads only the top-assembly data 301, the sub-assembly data 310 and parts data 311. Then, the saving process for the loaded data is performed. At this time, the structure information is updated. In the updating process, the at-registration information about only the loaded data is updated.

Figure 21:
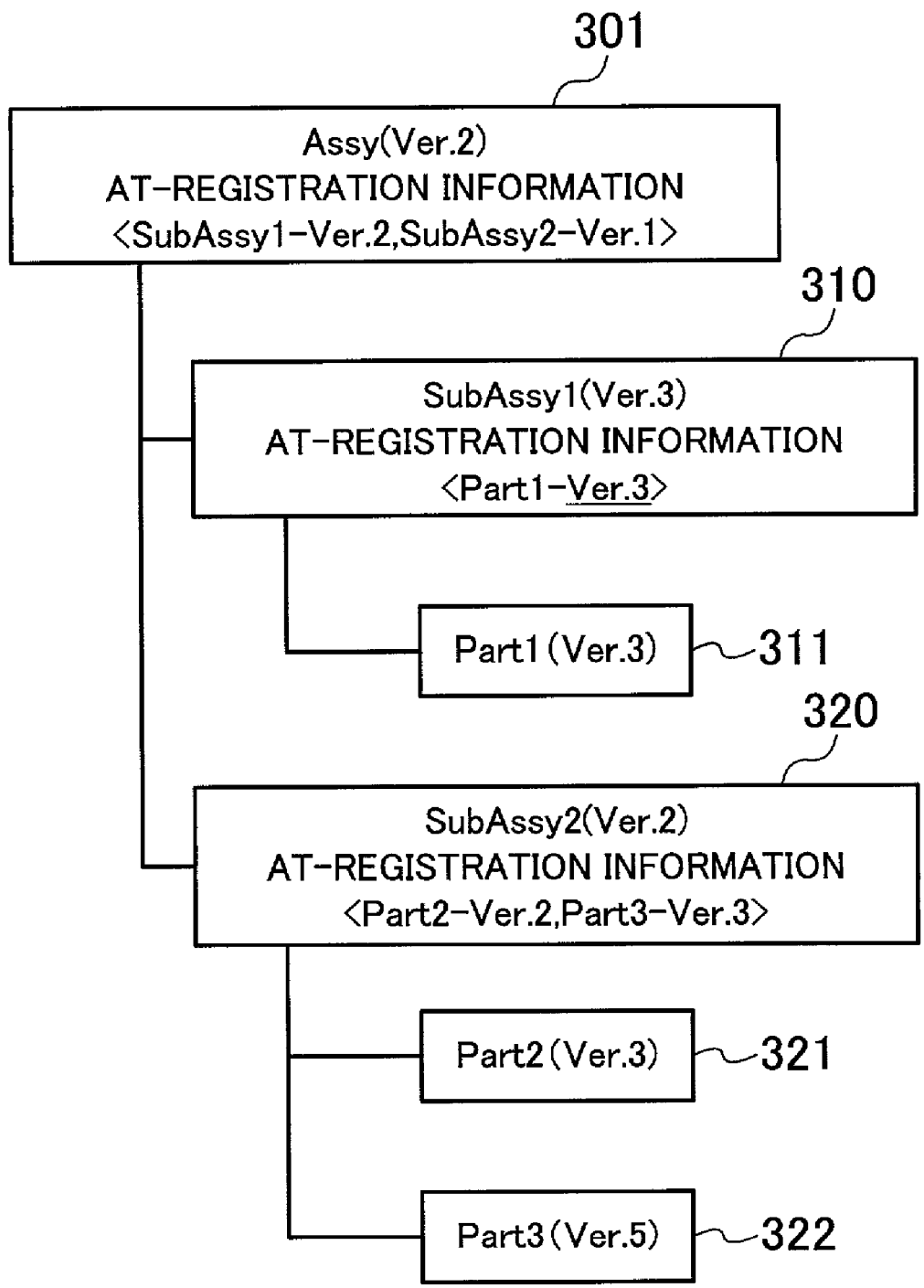
FIG. 21 illustrates a data structure obtained after the saving process for the loaded data shown in FIG. 20 is executed.

FIG. 21 shows a data structure obtained after the data saving process. In the example shown in FIG. 21, the at-registration information about only the sub-assembly data 310 has been updated (the updated information is underlined). That is, the at-registration information about the sub-assembly data 310 has been changed to <Part1-Ver.3>.

In this manner, the at-registration information about only loaded data is updated in the partial loading. This makes it possible to confirm the structure of only part of the product and update the at-registration information thereon.

[Mass Update Process for At-registration Information]

All the at-registration information about the structures located below the designated assembly may be updated to the respective latest versions. For example, a command for updating all the at-registration information is prepared. When the command for updating all the at-registration information is designated in a state in which a desired assembly is selected on the screen, the at-registration information about the structures located below the selected assembly are all updated to the respective latest versions.

For example, when the top-assembly data 301 in the CAD data shown in FIG. 19 is designated and the command for updating all the at-registration information is entered, the CAD data is updated as follows.

Figure 22:
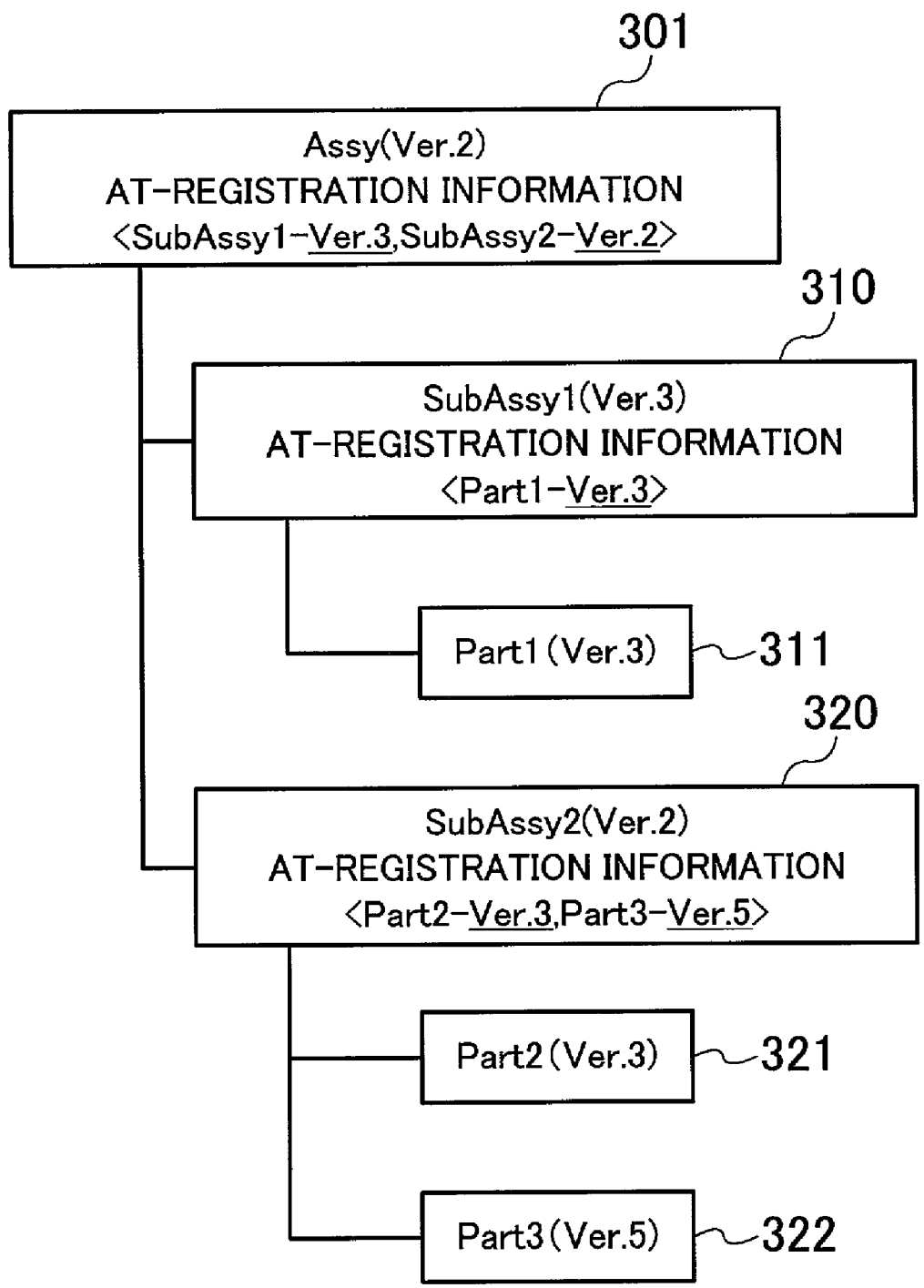
FIG. 22 illustrates CAD data after all at-registration information is updated.

FIG. 22 shows CAD data after all the at-registration information is updated. In the example shown in FIG. 22, the at-registration information about the top-assembly data 301 and the items 310 and 320 of assembly data have been updated (the items of updated information are underlined). That is, the at-registration information about the top-assembly data 301 has been changed to <SubAssy1-Ver.3, SubAssy-Ver.2>. The at-registration information about the sub-assembly data 310 has been changed to <Part1-Ver.3>. The at-registration information about the sub-assembly data 320 has been changed to <Part2-Ver.3, Part3-Ver.5>.

In the above-mentioned manner, the at-registration information can be updated without loading data. For example, in a case where an assembly is confirmed by drawings printed on a sheet of paper, the at-registration information about the assembly can be updated without loading the assembly data. In this case, the unloading of CAD data makes it possible to reduce the time necessary for updating the at-registration information, as compared to the loading of CAD data.

[Selective Updating Process for At-registration Information]

It is possible to update the at-registration information about only a selected object. For example, all the versions of the objects located below the selected object are displayed on the object basis. The version that is to be saved as at-registration information is designated on the screen. The at-registration information about the selected object is updated so that the designated version is described in the at-registration information.

Figure 23:
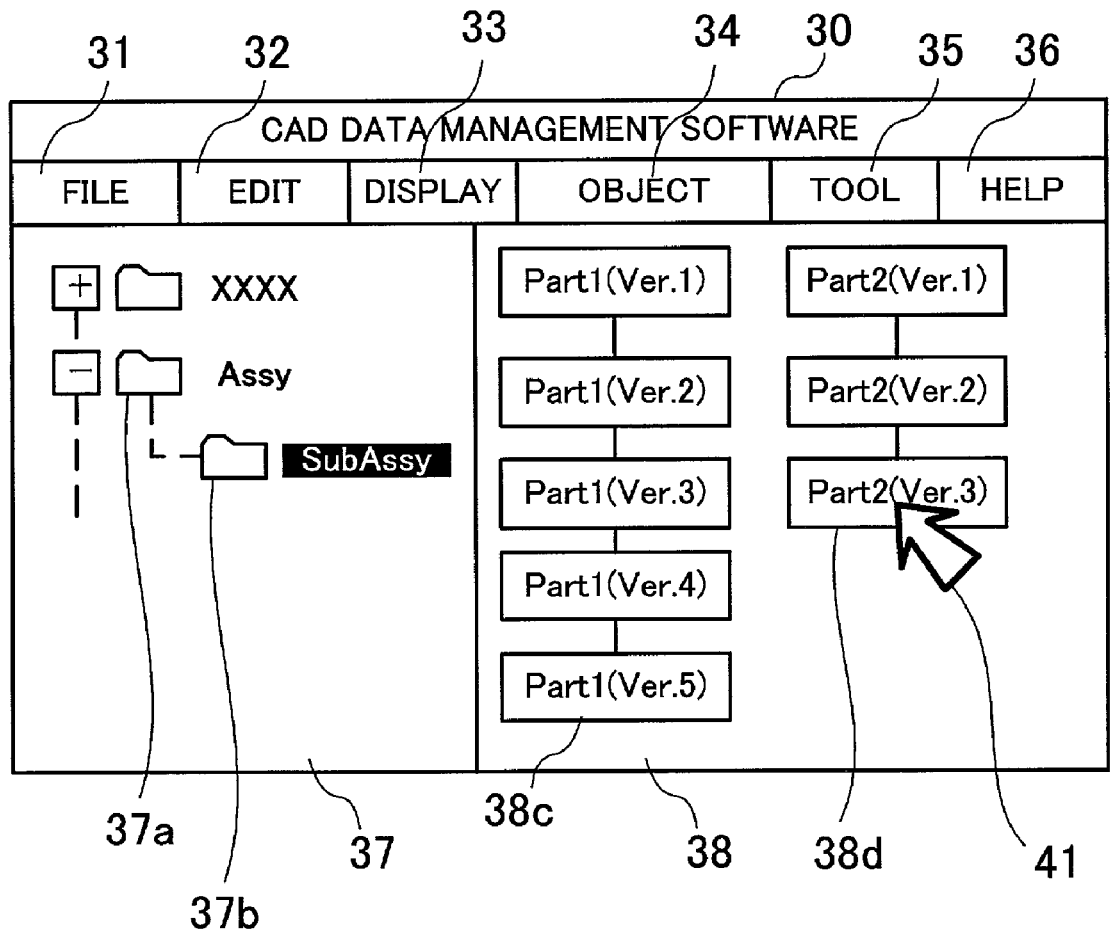
FIG. 23 is a view of a screen on which all versions are displayed.

FIG. 23 is a view of a display screen on which all the versions are displayed. The display screen shown in FIG. 23 is the same as that shown in FIG. 7 except for the contents of the data display area 38. Thus, any part shown in FIG. 7 that is the same as a part shown in FIG. 23 is denoted by the same reference numeral in both figures, and a description thereof is omitted here.

In the data display area 38 shown in FIG. 23, displayed are the latest versions and old versions of the parts data 38c and those of the parts data 38d of parts data that form the lower structure located under the sub-assembly 37b. The operator moves the cursor 41 to a desired version of desired parts data, and selects it. When the operator enters the command for updating the at-registration information, the version of the selected parts data are set as at-registration information about the sub-assembly 37b.

In the above-mentioned manner, the version of the at-registration information can be arbitrarily designated. This makes it possible to return the version of the at-registration information to the old one.

[Process of Initializing At-registration Information about Copied Object]

When a copy of an object is made, the at-registration information about this object may be initialized. For example, there may be a case where an object of an assembly of a product is copied and is used to form a part of another product. In this case, the copied object has not been confirmed from a viewpoint such that the copied object forms a part of another product. However, it is possible to prevent an approval request for an assembly that has not been confirmed from being made by initializing the at-registration information about the copied object. In the initialization of the at-registration information, the oldest version of each object is set as the at-registration information.

[Process of Diverting At-registration Information about Diverted Object]

When an object is diverted, the at-registration information about the object of the diversion source may be applied to the at-registration information about the diversion destination object. That is, the object may be diverted so as to include the at-registration information about that object. By diverting the at-registration information, when the at-registration information of the source of diversion is updated, the at-registration information about the destination thereof is also updated.

The diversion of the object means that a part (diversion-source object) of a product (diversion-source product) is designated as a part (diversion-destination object) of another product (diversion-destination product). In this case, the CAD data of the diversion-destination product has information indicating the diversion-source object instead of the CAD data of the diversion-destination object.

The object can be diverted to the diversion-destination product only in a case where, if the object is approved as a formal object with regard to the diversion-source product, the object can be applied to the diversion-destination product. Thus, if the diversion-destination product is confirmed separately from the diversion-source product, the confirmation works will be overlapping. In order to avoid the overlapping works, the at-registration information about the diversion-source object is used as the at-registration information about the diversion-destination object. This simplifies the work of confirming the diversion-destination product.

[Process of Displaying Difference from At-registration State]

If the version of an object that has been loaded is compared with the respective at-registration information and it is determined that the version of the loaded object is newer than that defined by the at-registration information, the newer object may be emphatically displayed on the CAD screen. This can be realized as follows.

When an object is updated, an update flag is given to data of the new version. When the at-registration information about the upper assembly is updated, the update flag is erased from data of the versions that are older than the version defined in the at-registration information. When the data of the object is loaded, this object is emphatically displayed if the update flag assigned to the object is on.

Figure 24:
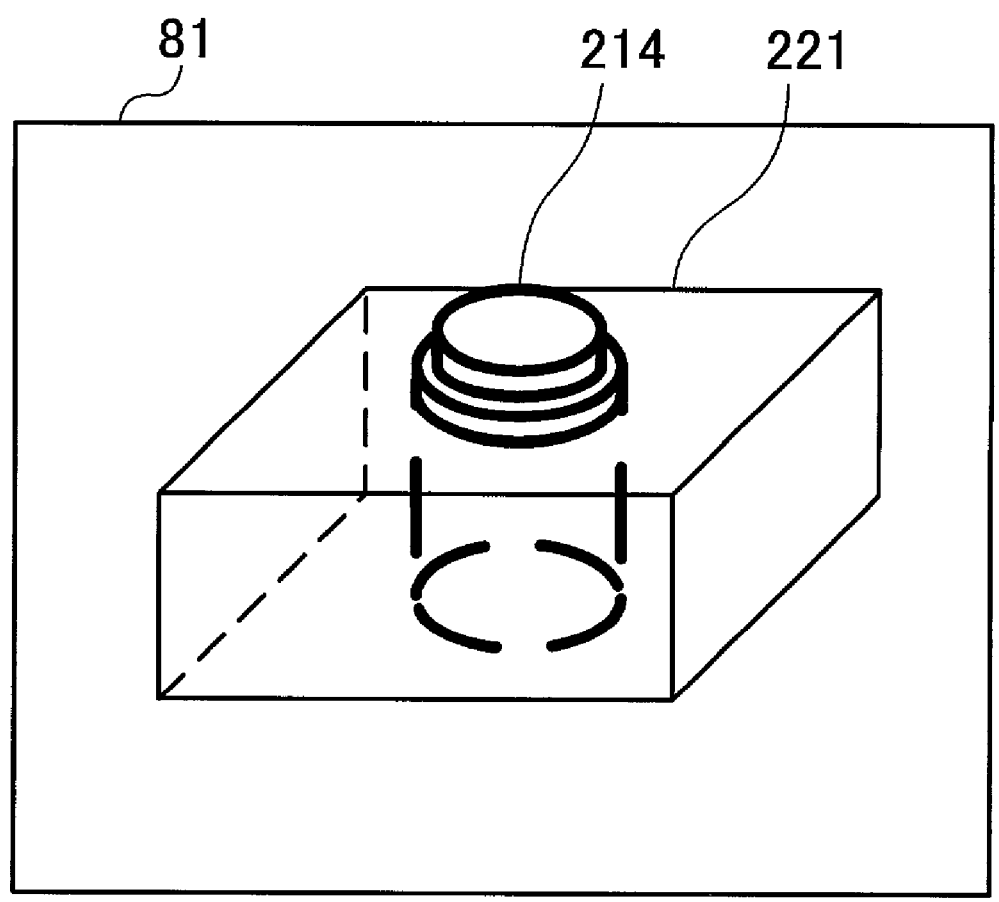
FIG. 24 is a view of a screen on which an updated object is emphatically displayed.

FIG. 24 is a view of a screen on which the updated object is emphatically displayed. FIG. 24 is the same as FIG. 11 except for the way of displaying the part 214. FIG. 24 shows an example in which parts data of the sixth version about the first part (Part1) is created using CAD data having the data structure shown in FIG. 16, and the latest state of the parts data is displayed. The part 214 has been changed from the assembly structure that was confirmed last time. Thus, the shape of the part 214 is determined by the parts data of the version (sixth version) that is newer than the version thereof at the time of loading data (fifth version).

In the example shown in FIG. 24, the part 214 is drawn by a solid line thicker than the other objects. Another way of making an emphasis-added display is to display the updated object with a color different from that of another object or to highlight the updated object.

[Application to Client Server System]

The processes of the present embodiment of the invention can be implemented by a client server system. For example, the database 50 is provided in a server, and the other processes are provided in clients. The client server system is useful to a case where many designers cooperate with each other to design a product.

[Implementation by Recording Medium]

The above-mentioned processes can also be implemented by a computer. The functions of the computer that implement the processes are described in a program recorded on a computer readable recording medium. The computer executes the program so that the above-mentioned processes can be performed by the computer. Examples of the computer readable recording medium are a magnetic storage device and a semiconductor memory. The computer readable recording medium may be placed in the market in the form of a portable type recording medium such as a floppy disk or a CD-ROM (Compact Disk Read Only Memory). The program may be stored in a storage device of a computer connected to a network and may be transferred to another computer via the network. Usually, the program is stored in a hard disk drive provided in the computer and is loaded into a main memory therefrom when the program is executed.

As described above, according to the present invention, when the structure of a unit is displayed, version information about parts that form the displayed unit are added to assembly data. By referring to the version information added to the assembly data, the unit used when the structure was confirmed can be reproduced. As a result, the previously confirmed structure can be easily reconfirmed.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the present invention in the appended claims and their equivalents.

What is claimed is:

1. A computer readable recording medium storing a program for causing a computer to perform operations, comprising:
    displaying a unit based on assembly data and parts data in response to a display request, the parts data including data about shapes of individual parts and version information about versions of the individual parts, the assembly data defining a structure of the unit formed by one or more of the individual parts;
    storing the assembly data of the unit together with the version information about all of the individual parts that form the unit displayed, while assigning version information of the unit to the assembly data to be stored;
    storing current and past versions of the parts data of each individual part; and
    copying a newer version of the assembly data as a new object and assigning thereto the oldest version information of the assembly data to prevent an approval request for the new object from being made.

2. The computer readable recording medium as claimed in claim 1, further comprising:
    displaying the individual parts of the unit based on parts data of a version different from a latest version when the display request is directed to states of the individual parts at registration of the parts data.

3. The computer readable recording medium as claimed in claim 1, wherein part of the parts data is sub-assembly data that defines a sub-unit formed by one or more of the other individual parts.

4. The computer readable recording medium as claimed in claim 3, further comprising:
    causing the sub-unit defined in the sub-assembly data specified in the display request to be displayed; and
    assigning version information about the individual parts that form the sub-unit displayed to the sub-assembly data specified in the display request.

5. The computer readable recording medium as claimed in claim 3, further comprising updating, in response to an at-registration information updating request, the version information about the assembly data and the sub-assembly data having a lower structure with respect to the assembly data to latest versions thereof.

6. The computer readable recording medium as claimed in claim 1, further comprising diverting, when the assembly data used to form a first product is diverted to a second product, the version information about the assembly data of the first product to diverted assembly data of the second product.

7. A CAD data management apparatus managing CAD data, comprising:
    data storage means for storing current and past versions of parts data including data about shapes of individual parts and version information about versions of the individual parts, and assembly data defining a structure of a unit including one or more of the individual parts;
    display control means for acquiring, in response to a display request, the assembly data and the parts data of the individual parts that form a unit from the data storage means and causing the unit defined in the assembly data to be displayed;
    means for saving into the data storage means the assembly data of the unit together with the version information about all of the individual parts that form the unit displayed by the display control means, while assigning version information of the unit to the assembly data to be stored; and
    copying a newer version of the assembly data as a new object and assigning thereto the oldest version information of the assembly data to prevent an approval request for the new object from being made.

8. A CAD data management method for managing CAD data, comprising:
    displaying a unit based assembly data and parts data in response to a display request, the parts data including data about shapes of individual parts and version information about versions of the individual parts, the assembly data defining a structure of the unit formed by one or more of the individual parts;
    storing the assembly data of the unit together with the version information about all of the individual parts that form the unit displayed, while assigning version information of the unit to the assembly data to be stored,
    storing current and past versions of the parts data of each individual part; and copying a newer version of the assembly data as a new object and assigning thereto the oldest version information of the assembly data to prevent an approval request for the new object from being made.

9. A method of managing computer-aided design data, comprising:
- displaying a unit based on assembly data and parts data, the parts data including information related to shapes of each individual part and version information related to each of the individual parts; and
- assigning the version information related to the individual parts to the assembly data, the assembly data forming a structure of the unit formed by the individual parts; and
- copying a newer version of the assembly data as a new object and assigning thereto the oldest version information of the assembly data to prevent an approval request for the new object from being made.

10. A method of managing computer-aided design data, comprising:
- storing version information defining a combination of individual parts that form a unit, the version information indicative of a version of each individual part that form the unit;
- referencing the version information of each of the individual parts and the combination of the individual parts forming the unit when creating a new combination of the individual parts; and
- copying a newer version of the assembly data as a new object and assigning thereto the oldest version information of the assembly data to prevent an approval request for the new object from being made.

* * * * *